United States Patent
Chang et al.

(10) Patent No.: US 7,964,933 B2
(45) Date of Patent: Jun. 21, 2011

(54) INTEGRATED CIRCUIT INCLUDING POWER DIODE

(75) Inventors: Paul Chang, Saratoga, CA (US); Geeng-Chuan Chern, Cupertino, CA (US); Prognyan Ghosh, Oakland, CA (US); Wayne Y. W. Hsueh, San Jose, CA (US); Vladimir Rodov, Seattle, WA (US)

(73) Assignee: Diodes Inc., Westlake Village, CA (US)

( * ) Notice: Subject to any disclaimer, the term of this patent is extended or adjusted under 35 U.S.C. 154(b) by 419 days.

(21) Appl. No.: 11/821,234

(22) Filed: Jun. 22, 2007

(65) Prior Publication Data

US 2007/0246794 A1    Oct. 25, 2007

Related U.S. Application Data

(63) Continuation of application No. 11/040,280, filed on Jan. 20, 2005, now Pat. No. 7,145,400.

(51) Int. Cl.
    *H01L 21/76*    (2006.01)
(52) U.S. Cl. ........... 257/501; 257/500; 257/E21.532; 257/E21.536; 257/E21.54
(58) Field of Classification Search .............. 257/499, 257/500, 501, E21.532, E21.536, E21.54
    See application file for complete search history.

(56) References Cited

U.S. PATENT DOCUMENTS

| | | | |
|---|---|---|---|
| 3,861,968 A * | 1/1975 | Magdo et al. | 438/228 |
| 4,027,325 A | 5/1977 | Genesi | |
| 5,166,089 A | 11/1992 | Chen et al. | |
| 5,422,299 A | 6/1995 | Neudeck et al. | |
| 5,818,084 A | 10/1998 | Williams et al. | |
| 6,186,408 B1 | 2/2001 | Rodov et al. | |
| 6,420,225 B1 * | 7/2002 | Chang et al. | 438/237 |
| 6,448,160 B1 | 9/2002 | Chang et al. | |
| 6,515,330 B1 * | 2/2003 | Hurtz et al. | 257/328 |
| 6,624,030 B2 | 9/2003 | Chang et al. | |
| 6,743,703 B2 | 6/2004 | Rodov et al. | |
| 6,765,264 B1 | 7/2004 | Chang et al. | |
| 6,991,977 B2 * | 1/2006 | Kocon | 438/206 |

(Continued)

FOREIGN PATENT DOCUMENTS

EP    0817257 A    1/1998

OTHER PUBLICATIONS

Form EPO/1507S, "EPO Communication," 1 pg.

(Continued)

*Primary Examiner* — Leonardo Andújar
*Assistant Examiner* — William Harriston
(74) *Attorney, Agent, or Firm* — Courtney IP Law; Barbara B. Courtney

(57) ABSTRACT

A method of fabricating a semiconductor integrated circuit including a power diode includes providing a semiconductor substrate of first conductivity type, fabricating a integrated circuit such as a CMOS transistor circuit in a first region of the substrate, and fabricating a power diode in a second region in the semiconductor substrate. Dielectric material is formed between the first region and the second regions thereby providing electrical isolation between the integrated circuit in the first region and the power diode in the second region. The power diode can comprise a plurality of MOS source/drain elements and associated gate elements all connected together by one electrode of the diode, and a semiconductor layer in the second region can function as another source/drain of the power diode.

10 Claims, 34 Drawing Sheets

Top View

The shape of the unit cell could be any shape such as square, circle, strip, etc.

U.S. PATENT DOCUMENTS

| | | | | |
|---|---|---|---|---|
| 7,345,342 | B2* | 3/2008 | Challa et al. | 257/341 |
| 7,405,452 | B2* | 7/2008 | Yilmaz | 257/409 |
| 7,427,800 | B2* | 9/2008 | Yilmaz | 257/488 |
| 2002/0074595 | A1 | 6/2002 | Chang et al. | |
| 2003/0214011 | A1* | 11/2003 | Jianjun et al. | 257/500 |
| 2003/0222290 | A1 | 12/2003 | Rodov et al. | |
| 2004/0022025 | A1 | 2/2004 | Yokogawa et al. | |
| 2004/0084721 | A1* | 5/2004 | Kocon et al. | 257/328 |
| 2004/0084724 | A1* | 5/2004 | Kapels et al. | 257/330 |
| 2006/0049453 | A1* | 3/2006 | Schmitz et al. | 257/330 |

OTHER PUBLICATIONS

Form EPO/1503, "Supplementary European Search Report," 1 pg.
Form EPO/P0459, "Annex to the European Search Report on European Patent Application No. EP 06718439," 1 pg.
Form EPA/2906, "Examination Information," 5 pgs.
Gilbert P V et al: "Quasi-Dielectrically Isolated Bipolar Junction Transistor With Subcollector Fabricated Using Silicon Selective Epitaxy" IEEE Transactions on Electron Devices, IEEE Service Center, Piscataway, NJ, US, vol. 38, No. 7, Jul. 1, 1991, pp. 1660-1665, XP000206665 ISSN: 0018-9383 Section I: "Introduction"; *figure 2*.
Form PCT/ISA/220, "PCT Notification of Transmittal of The International Search Report and the Written Opinion of the International Searching Authority, or the Declaration," 1 pg.
Form PCT/ISA/210, "PCT International Search Report," 3 pgs.
Form PCT/ISA/237, "PCT Written Opinion of the International Searching Authority," 5 pgs.
Form PCT/IB373, "PCT International Preliminary Report on Patentability," 1 pg.

\* cited by examiner

Fig. 1. (i) starting material: P- or P-/P+ substrate; (ii) Photoresist pattern to define Super Diode area(s)*
*If more than one Super Diodes are required, multiple photoresist openings should be defined.

Fig. 2. (i) oxide etch; (ii) Silicon etch to form a trench*
*Silicon etch can also be performed after photoresist removal.

Fig. 3. (i) remove photoresist; (ii) form oxide or nitride spacers on side walls of Si trench (optional); (iii) Selective epitaxial deposition to form a layer of N+ region (optional) and then an N- region to fill up the Si trench, by using oxide as a mask Fig. 4. (i) remove oxide; (ii) use conventional Shallow Trench Isolation (STI) method to form isolation areas (could also use conventional local oxidation method)

Fig. 5. (i) Photoresist pattern to define deep N+ implant; (ii) Phos and/or As Implant Fig. 6. (i) Photoresist pattern to define P-guard ring and P-plug (optional; not shown) areas;
(ii) Boron and BF$_2$ Implant Fig. 7. (i) Remove photoresist; (ii) Form N-well & P-well for IC Fig. 8. Form gate oxide (3-30 nm)*

*If the gate oxide thickness of Super Diode is different from that of the IC transistors, gate oxide formation for two times with the convention photo masking process are necessary.

Fig. 9. (i) Deposit first layer of poly (30-250 nm); (ii) Form photoresist pattern to cover the IC area and to expose Super Diode area*

*If the poly thickness of Super Diode is the same as that of the IC transistors, the photo masking, etching & 2nd poly deposition steps are not necessary.

Fig. 10. poly etch*
*If the poly thickness of Super Diode is the same as that of the IC transistors, the photo masking, etching & 2nd poly deposition steps are not necessary.

Fig. 11. (i) Remove photoresist; (ii) Deposit 2nd layer of poly (30-150 nm)*
*If the poly thickness of Super Diode is the same as that of the IC transistors, the photo masking, etching & 2nd poly deposition steps are not necessary.

Fig. 12. (i) form photoresist pattern to cover IC area; (ii) As implant (30-150 nm)

Fig. 13. (i) Remove photoresist; (ii) Deposition 100-400 nm CVD oxide; (iii) Photoresist pattern to define MOS transistor units for Super Diode and to cover IC area.

Fig. 14. (i) isotropic oxide etch (stop at poly); (ii) anisotropic poly etch; (iii) 1st Boron implant (dose=1.5~5.5E12/cm², energy=40~80KeV)*

*1st Boron implant can also be performed before anisotropic poly etch

Fig. 15. (i) oxide etch (preferred to be anisotropic); (ii) As implant (dose=1.0~5.0E13; energy=20~60KeV)*; (iii) RTA to activate As
*As implant can also be performed before oxide etch.

Fig. 16. (i) anisotropic Si etch (remove 50-200nm Si); (ii) BF$_2$ implant (dose=1.0~5.0E15; energy=10~60KeV); (iii) RTA to activate BF$_2$ Fig. 17. (i) removal photoresist; (ii) 2nd Boron implant (dose=$1.0\sim2.5E12/cm^2$, energy=$20\sim60KeV$) to create lateral grade P-type pockets; (iii) RTA to activate Boron Fig. 18. (i) form photoresist pattern to cover Super Diode area and to expose IC area; (ii) oxide etch to remove CVD oxide in IC area Fig. 19. (i) remove photoresist; (ii) form another photoresist pattern to cover Super Diode area and to define MOS transistor gate areas; (iii) anisotropic poly etch Fig. 20. (i) remove photoresist; (ii) form another photoresist pattern to cover Super Diode area and P-channel MOS transistor (or N-well) areas; (iii) Phos and/or As implant to form N-channel Source and Drain and to dope N-channel transistor gate poly Fig. 21. (i) remove photoresist; (ii) form another photoresist pattern to cover Super Diode area and N-channel MOS transistor (or P-well) areas; (iii) B and/or $BF_2$ implant to form P-channel Source and Drain and to doped P-channel transistor gate poly Fig. 22. (i) remove photoresist; (ii) Deposit a layer of inter-dielectric such as CVD oxide, PSG or BPSB Fig. 23. (i) Form photoresist pattern to define contact areas; (ii) oxide etch to open contact areas Fig. 24. (i) Remove photoresist; (ii) Form metal interconnect by depositing a layer of metal* and using conventional photo masking and then etching method

* The materials for metal interconnect could be Ti, TiN, Ni, Ag, Au, Cu, Al, etc. or the combination of two or more materials.

Fig. 25. [Alternative I] (i) starting material: P- or P-/P+ substrate; (ii) use conventional Shallow Trench Isolation (STI) method to form isolation areas (could also use conventional local oxidation method)

Fig. 26. [Alternative I] (i) Photoresist pattern to define Super Diode area(s)*; (ii) Phos and/or As multiple implants with different energies and doses to form N-/N+well

*If more than one Super Diodes are required, multiple photoresist openings should be defined.

Fig. 27. [Alternative I] All same process steps as shown in Figs. 5-24.

Fig. 28. [Other Alternative]

Fig. 29. [Other Alternative]

Fig. 30. [Other Alternative]

Fig. 31. [Other Alternative]

FIG. 33 Top View

US 7,964,933 B2

INTEGRATED CIRCUIT INCLUDING POWER DIODE

CROSS REFERENCE TO RELATED PATENTS

This patent application is a continuation of U.S. patent application Ser. No. 11/040,280, filed Jan. 20, 2005 now U.S. Pat. No. 7,145,400, which is incorporated by reference in its entirety herein. This patent application is related to U.S. Pat. Nos. 6,186,408; 6,420,225; 6,448,160; 6,515,330; 6,624,030; 6,743,703; 6,765,264; and 6,979,861, the disclosures of which are incorporated herein by reference for all purposes.

BACKGROUND OF THE INVENTION

This invention relates generally to power semiconductor devices including power diode rectifiers, and more particularly the invention relates to a power diode fabricated in a semiconductor integrated circuit and the method of fabricating the same.

The above referenced patents and pending patent application disclose semiconductor power diodes and rectifiers including one or more MOSFET structures in which a common electrode contacts gates and source/drain regions in one surface of a semiconductor body. The diodes have low on resistance, fast recovery time, and a very low forward voltage drop. The diodes can function as a discrete device and in an integrated circuit. In one embodiment, one contact to the diode is the common electrode contacting the gates and source/drain regions in or on one surface of the semiconductor structure. Another contact can be placed on an opposing of the semiconductor structure or otherwise electrically contacting second source/drain regions in the semiconductor structure.

When fabricated as a component in an integrated circuit, the diode structure must be electrically isolated from the integrated circuit structure with power buses connecting electrodes of the diode to power contacts of the integrated circuit. The diode can the be effectively operated as a power source for the integrated circuit without adversely effecting circuit operation.

The present invention is directed to a process and resulting structure in which a power diode comprises an integral part of an integrated circuit.

SUMMARY OF THE INVENTION

In accordance with the invention, one or more diode regions are formed in a semiconductor substrate with the diode regions having a dopant conductivity opposite to the dopant conductivity of the substrate in which an integrated circuit is to be formed. For example, N−/N+ dopant can be implanted in a substrate having P−/P+ dopant. Alternatively, a trench can be formed in the semiconductor substrate and then refilled epitaxially with doped N−/N+ semiconductor material.

A diode region is electrically isolated from the integrated circuit region by shallow trench oxide isolation or by dielectric spacers on sidewalls of an etched trench in the substrate which is subsequently refilled by epitaxial semiconductor growth of conductivity opposite to the substrate.

A plurality of source/drain and gate regions are formed in a surface of the device region using the technology disclosed in the above commonly assigned patents and application. An internal source/drain region, which is connected to the surface source/drain region by gate controlled channels, is contacted from the surface of the semiconductor substrate through an implanted contact channel which is electrically isolated from the plurality of source/drain regions on the surface by shallow trench isolation, for example.

The resulting diode in the integrated circuit has the feature and performance of diodes described in the commonly owned patents, supra, with improved electrical isolation and electrical access from the substrate surface.

The invention and objects and features thereof will be more readily apparent from the following detailed description and appended claims when taken with the drawings.

DETAILED DESCRIPTION OF ILLUSTRATED EMBODIMENTS

Figure 32:
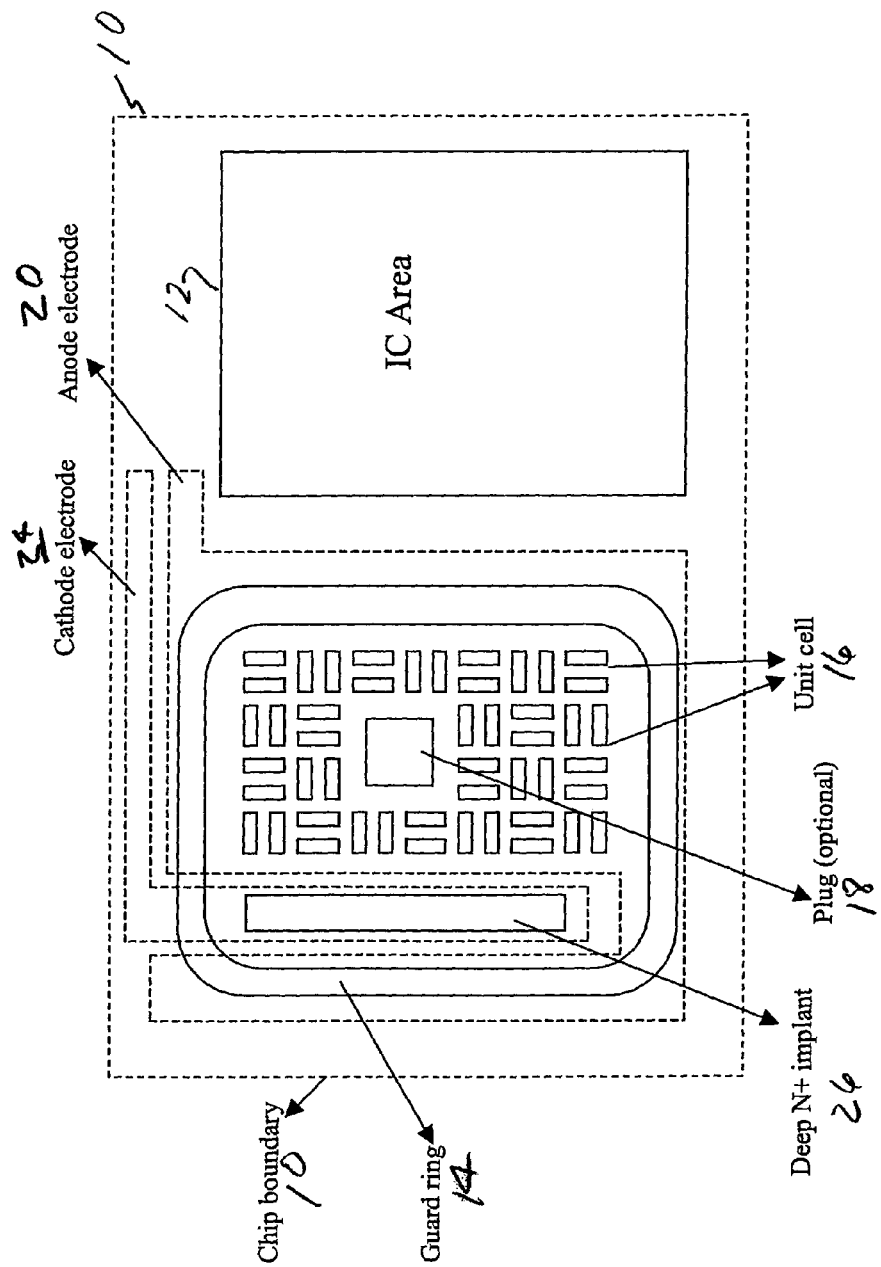
FIGS. 32-34 are top views illustrating integrated circuits including power diodes in accordance with embodiments of the invention.
Figure 33:
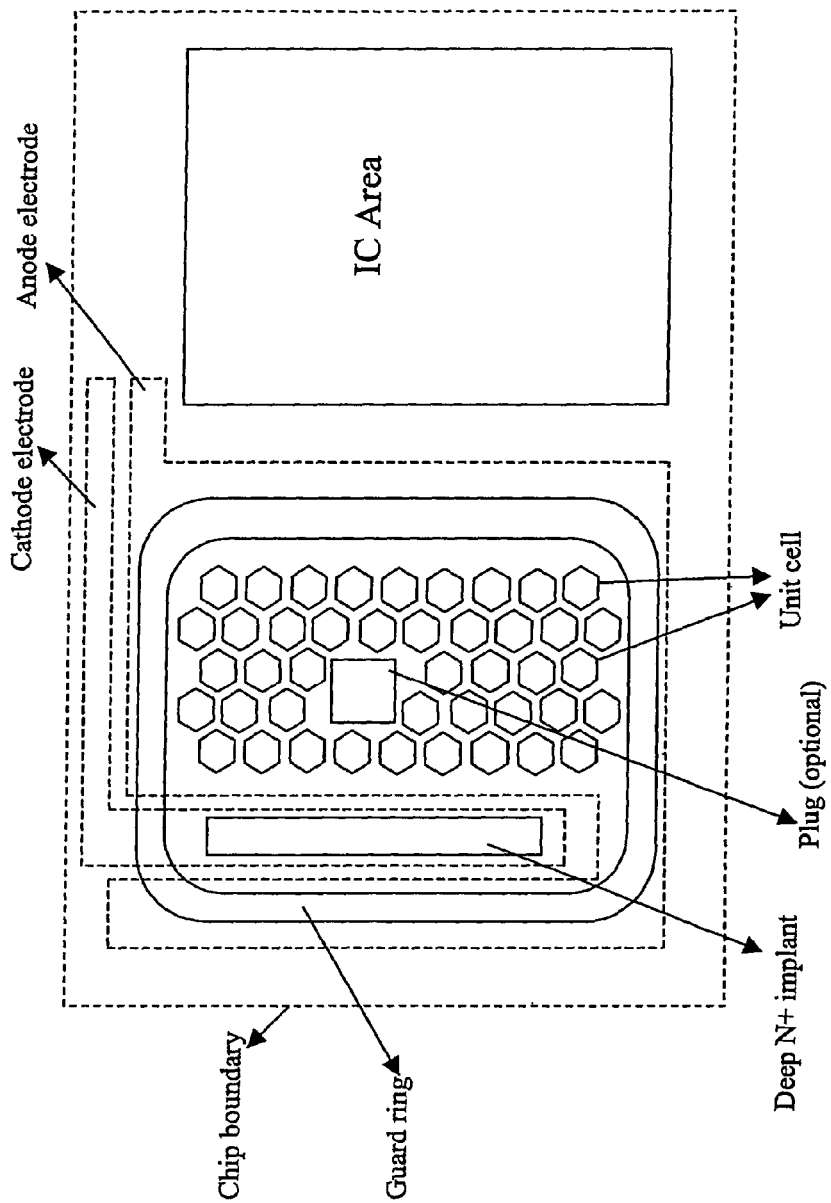
Figure 34:
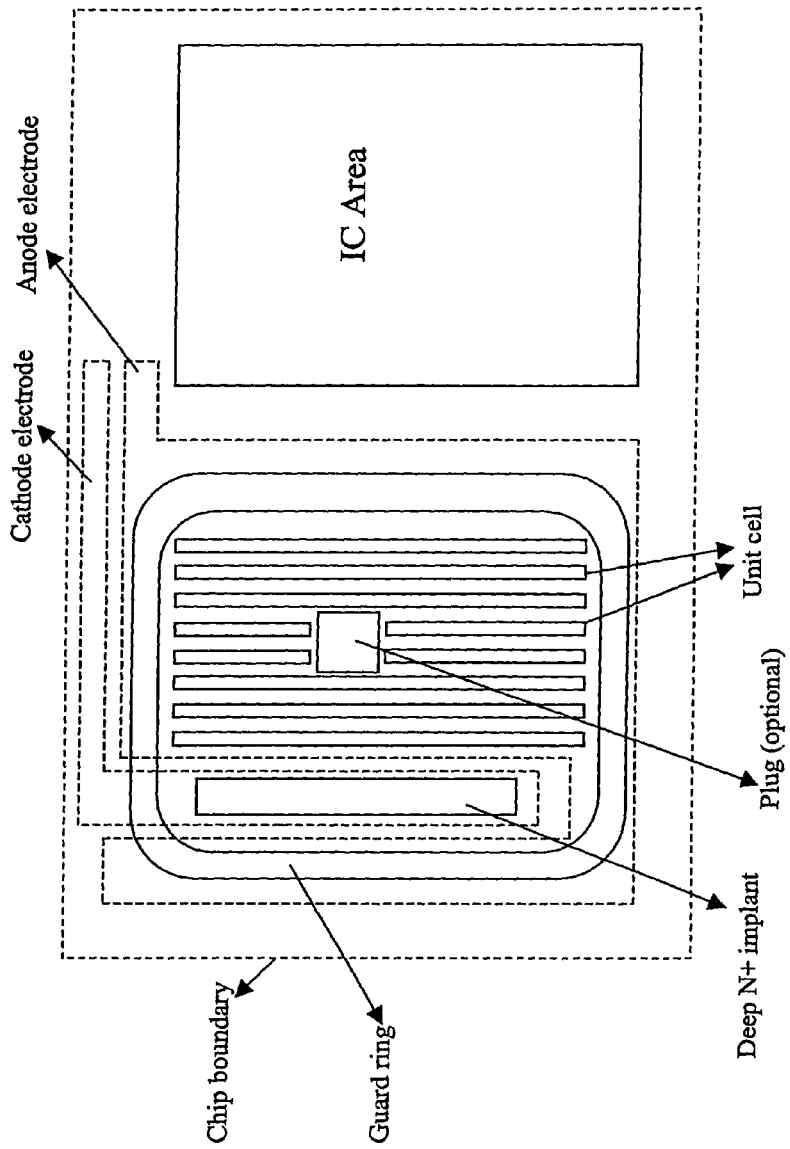

Power sources for integrated circuits require diode rectifiers which can be separate from the integrated circuit but which advantageously are incorporated in the integrated circuit. FIGS. 32-34 are top views illustrating integrated circuits including power diodes in accordance with embodiments of the present invention. Typically the integrated circuits are fabricated in a silicon substrate 10 with the integrated circuit fabricated in a first portion 12 of substrate 10 and a power diode fabricated within a guard ring 14 in a second portion of substrate 10. Guard ring 14 and the diode structures fabricated therein are electrically isolated from integrated circuit 12 as will be described further herein.

The diode within guard ring 14 comprises a plurality of unit cells 16, each of which includes a gate electrode and one or more surface oriented source/drain regions which are connected to an internal source/drain region though a gate controlled channel. An optional doped plug (P) 18 can be provided in the diode region as a bypass diode in parallel with unit cells 16. Anode 20 comprises common metallization to the gates and surface oriented source/drain regions of the unit cells 16, and a cathode electrode 24 contacts an internal source/drain region common to all unit cells through a deep N+ implant 26. In accordance with the invention, implant 26 is electrically isolated from the gates and surface source/drain regions of the unit cells, and the diode structure within guard ring 14 is dielectrically isolated from integrated circuit area 12.

As described in the referenced patents, the unit cells can take many forms including short rectangular structures as shown in FIG. 32, hexagonal structures as shown in FIG. 33, and elongated stripes as shown in FIG. 34.

Figure 1:
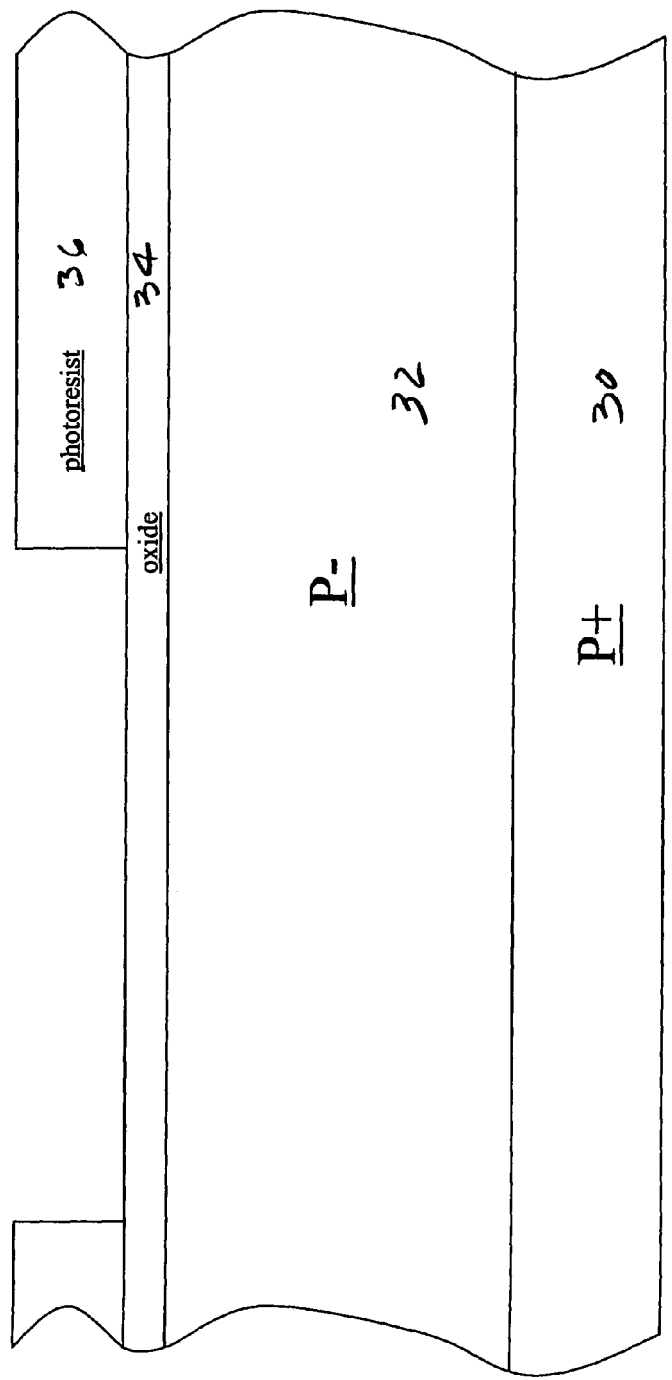
FIGS. 1-24 are section views illustrating steps in fabricating an integrated circuit including a power diode in accordance with embodiments of the invention.
Figure 2:
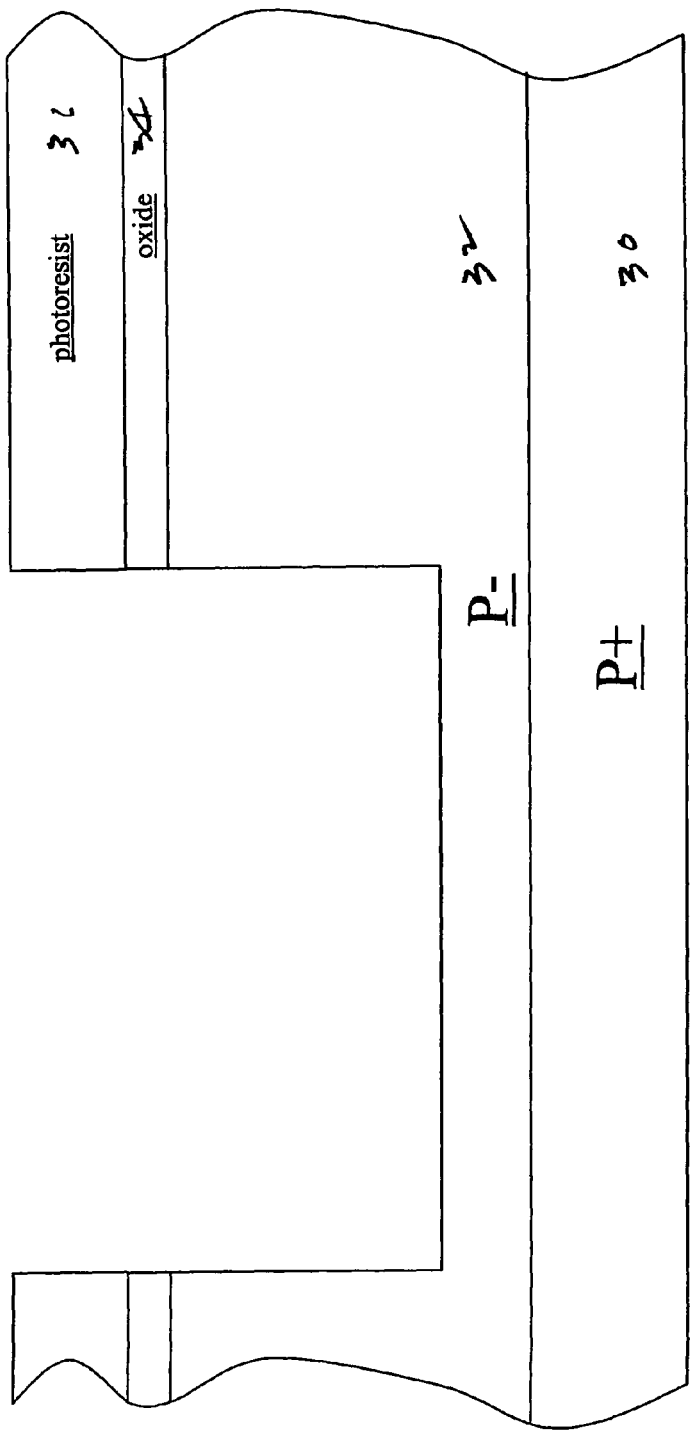
Figure 3:
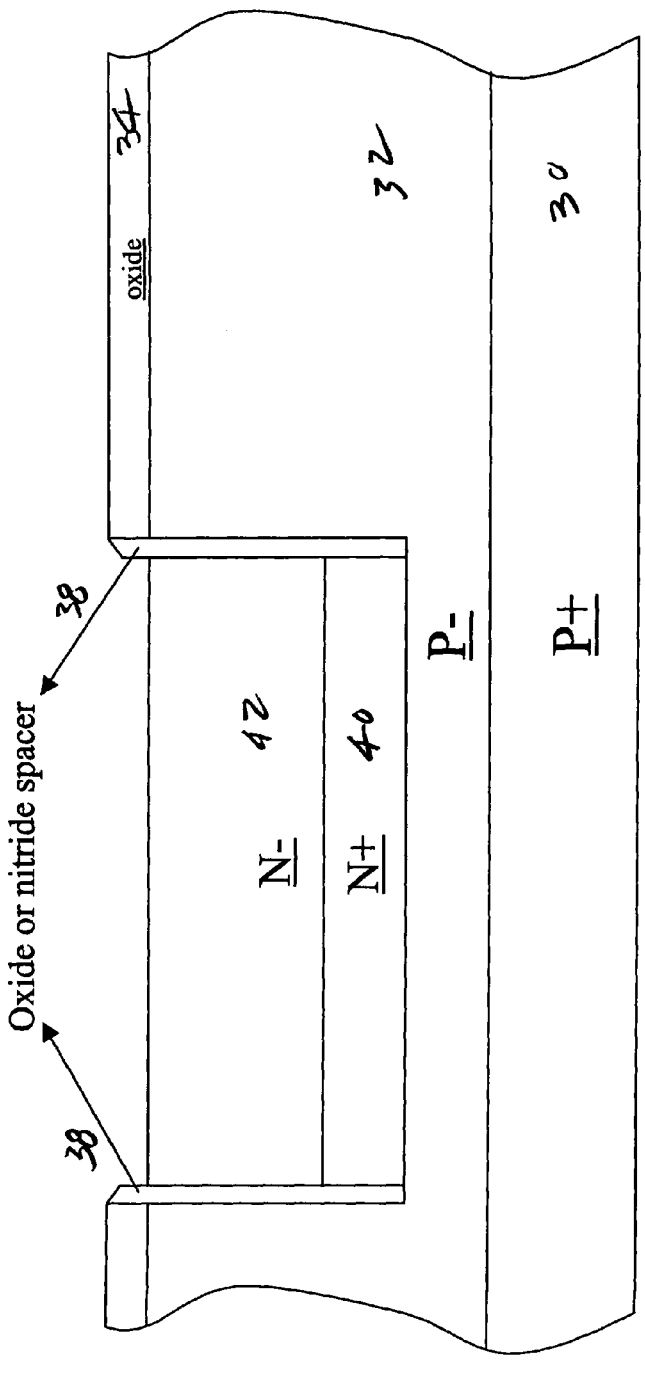

Consider now FIGS. 1-24 which are section views illustrating steps in fabricating an integrated circuit including a power diode in accordance with embodiments of the invention. The starting material is a silicon substrate including a P+ doped layer 30 and a P− doped layer 32 which can be epitaxially grown on layer 30. A silicon oxide layer 34 is grown on a surface of layer 32, and then a photoresist pattern 36 is formed on the surface of oxide 34 to define the power diode area. If more than one power diode is to be fabricated, multiple photoresist openings would be defined. In FIG. 2 a conventional anisotropic etch is performed to form a trench in silicon layer 32. Thereafter, as shown in FIG. 3, the photoresist is removed and silicon oxide or silicon nitride spacers 38 are formed on sidewalls of the silicon trench by vapor deposition followed by anisotropic etch to remove material from the bottom of the trench. After surface treatment to facilitate epitaxial growth, selective epitaxial deposition is employed to form N+ layer 40 and N− layer 42 which fill the trench. The oxide layer 34 functions as a mask for the selective epitaxial deposition.

Figure 4:
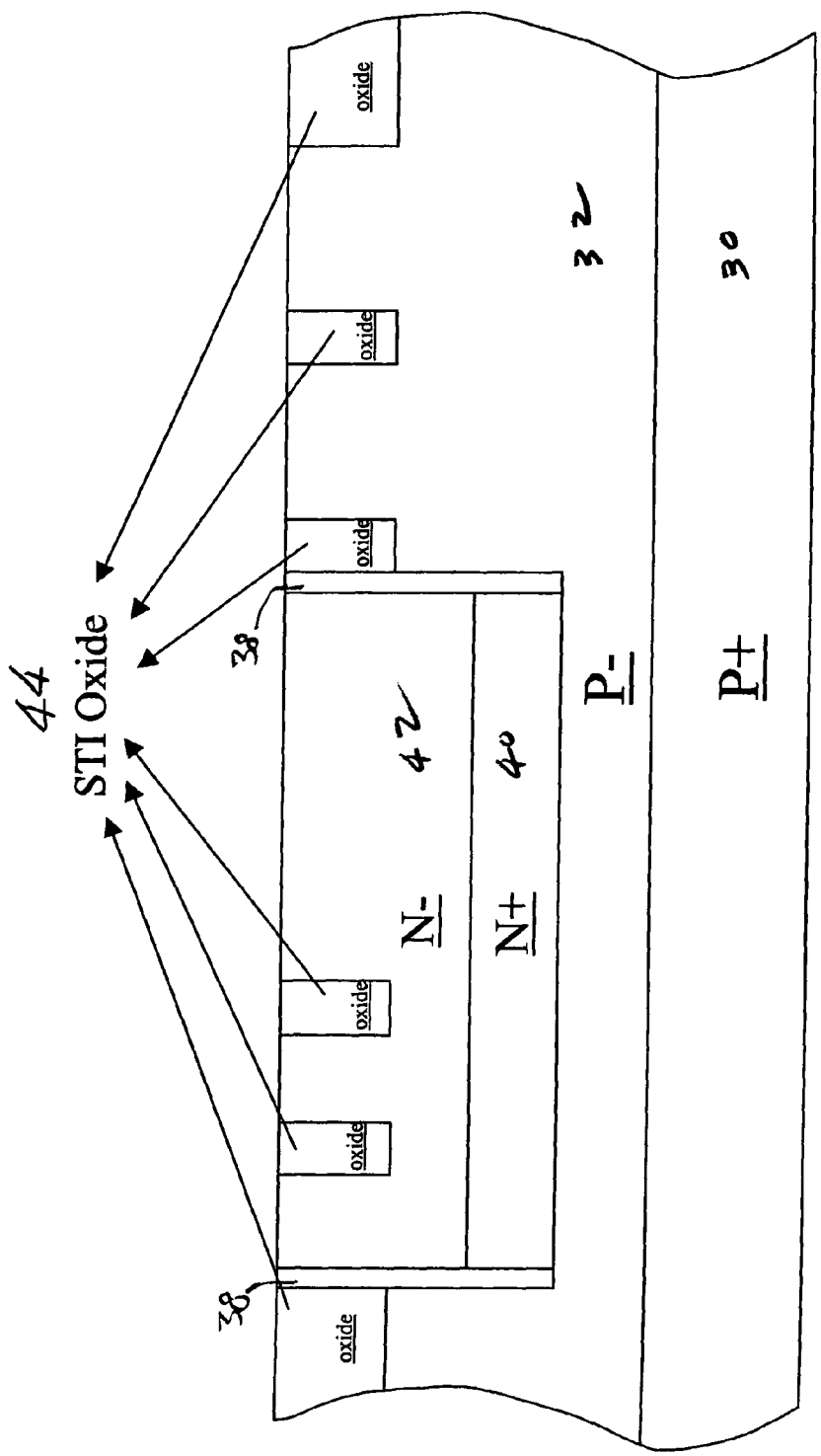
Figure 5:
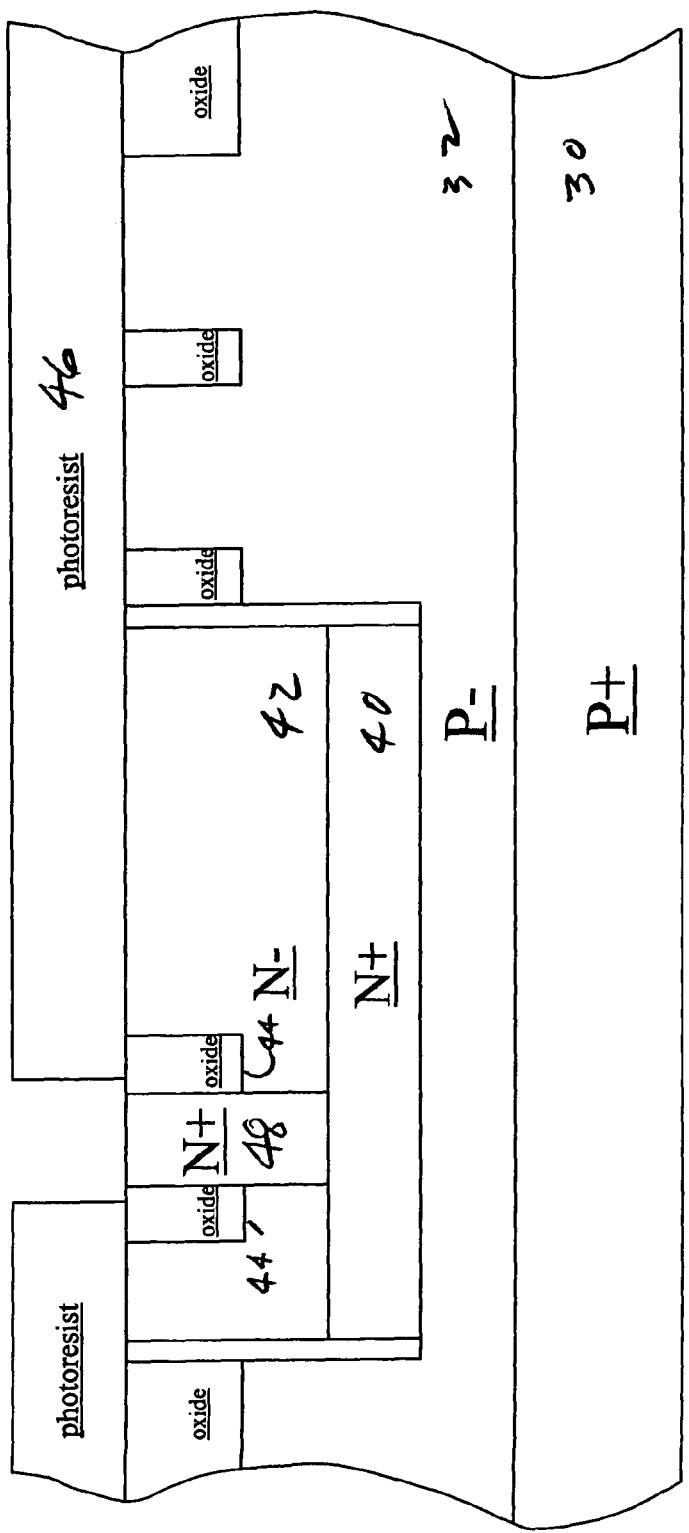

In FIG. 4 oxide 34 is removed by etching, and then a plurality of trenches are formed in the surface by anisotropic etch and then the trench surfaces are oxidized to form conventional shallow trench isolation (STI) 44. The surface of the structure is then patterned with photoresist 46 as shown in FIG. 5 to define a deep N+ implant 48 between two oxide isolation areas 44. Either phosphorus or arsenic can be used as the implanted N+ dopant.

Figure 6:
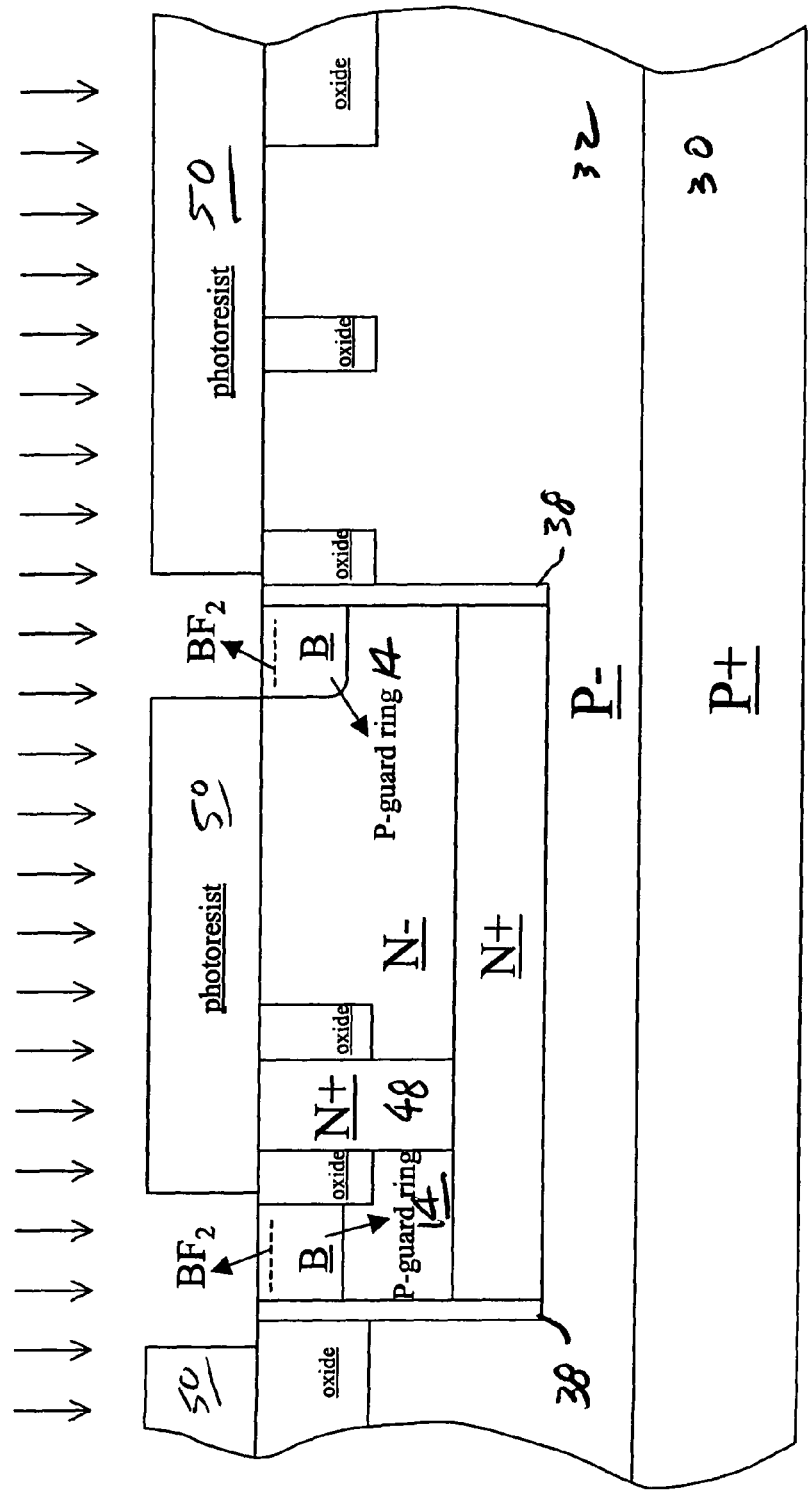

FIG. 6 photoresist 46 is stripped and a photoresist pattern 50 is formed over the surface to define a P guard ring and optionally a P plug (not shown) with boron and $BF_2$ implant forming guard ring 14.

Figure 7:
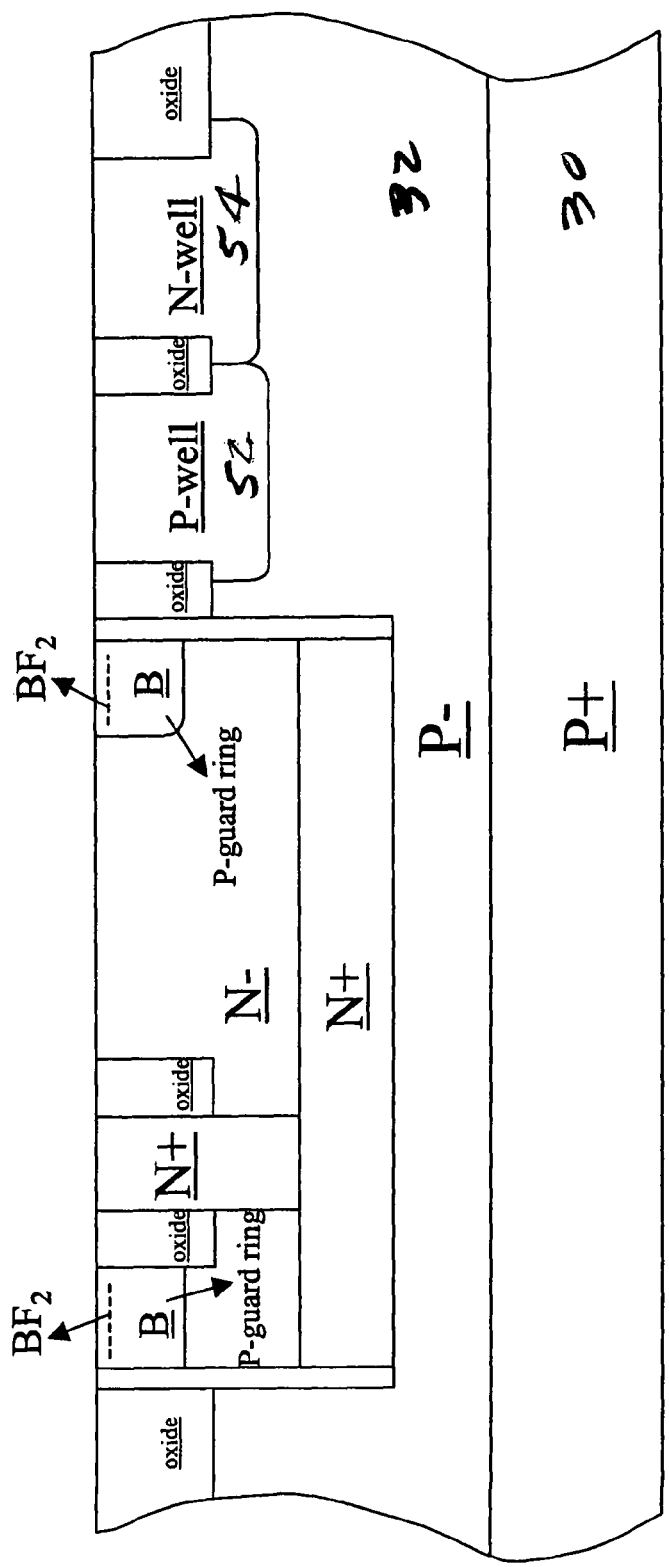
Figure 8:
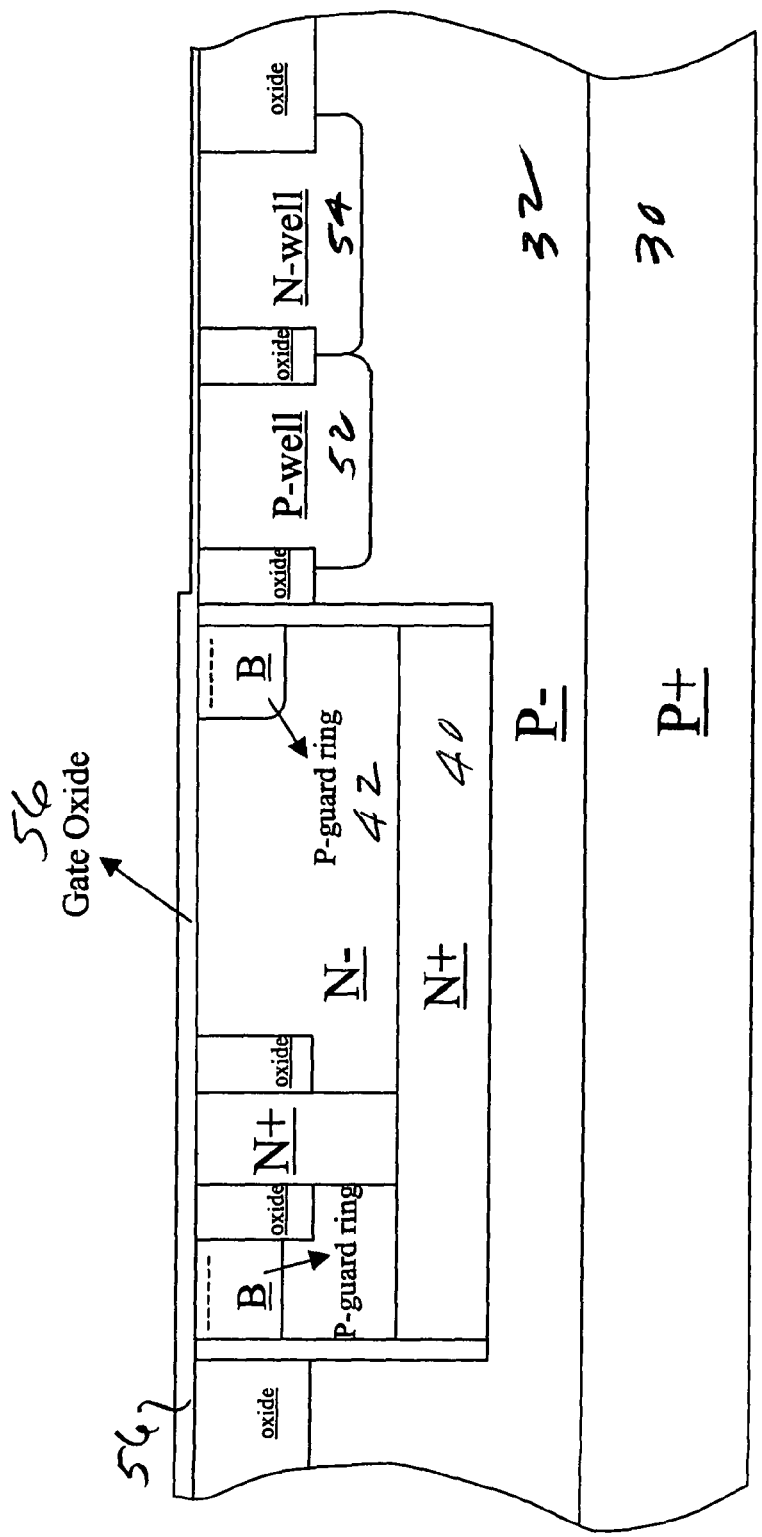
Figure 9:
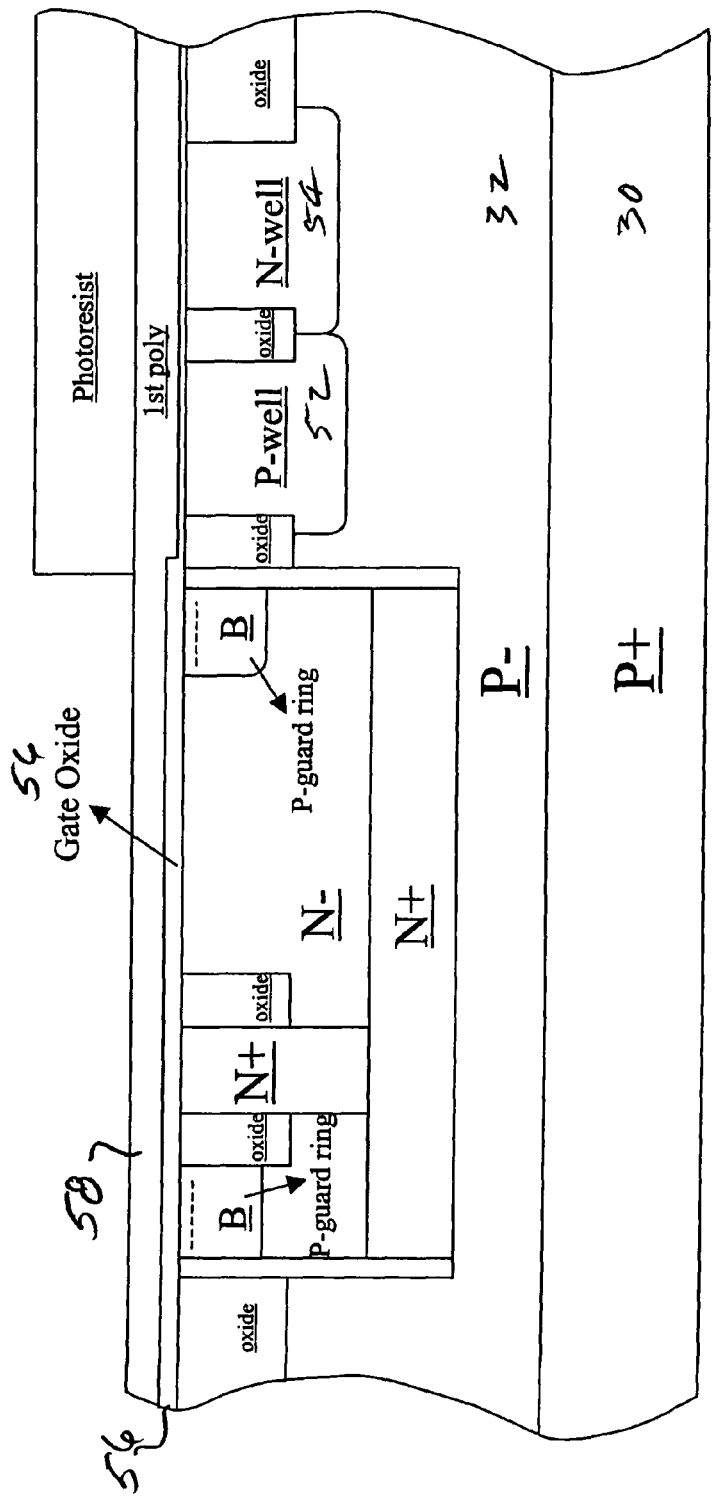
Figure 10:
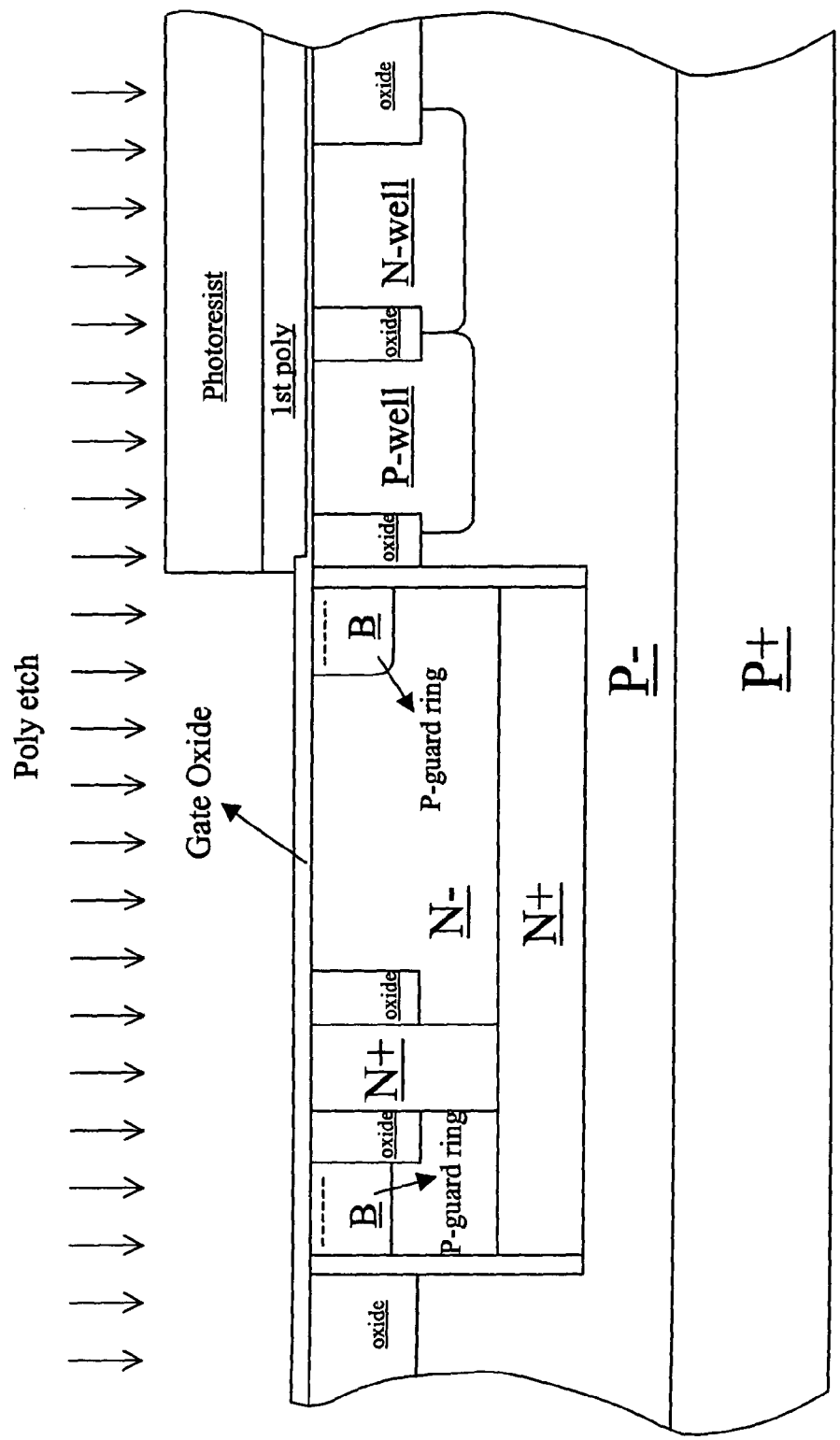
Figure 11:
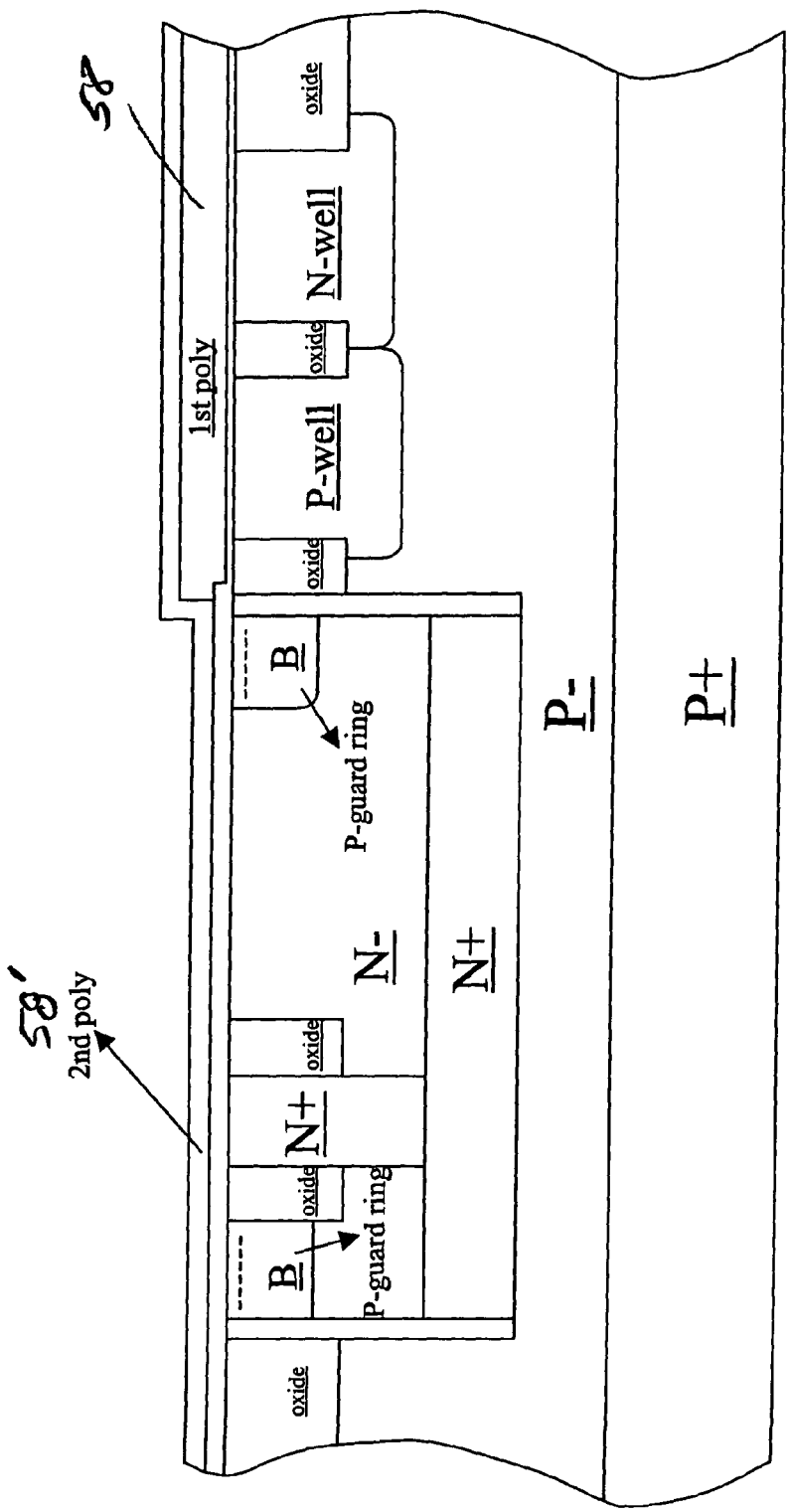

Following formation of guard ring 14, photoresist 50 is removed and the surface is again selectively masked for ion implantation in forming P wells 52 and N wells 54 for CMOS transistors in the integrated circuit, as shown in FIG. 7. Thereafter, gate oxide 56 is grown on the surface of the structure as shown in FIG. 8. If the gate oxide thickness of the power diode is different from that of the integrated circuit transistors in P well 52 and N well 54, then the gate oxide growth requires two different time periods with suitable masking to limit growth of the oxide over the integrated circuit wells. In FIG. 9 a first layer of polysilicon (30-250 nm) is deposited. If the polysilicon layer over the diode is different from that over the integrated circuit, photoresist masking as shown in FIG. 9 is employed to remove the polysilicon from over the diode by polysilicon etch as shown in FIG. 10, and then a second layer 58' of polysilicon (30-150 nm) is the deposited on the surface of the diode region and over the first polysilicon layer 58 over the integrated circuit region. (FIG. 11) Again, if the polysilicon thickness over the super diode is the same as the polysilicon thickness over the integrated circuit transistors, the photoresist masking, etching and second polysilicon deposition steps are not necessary.

Figure 12:
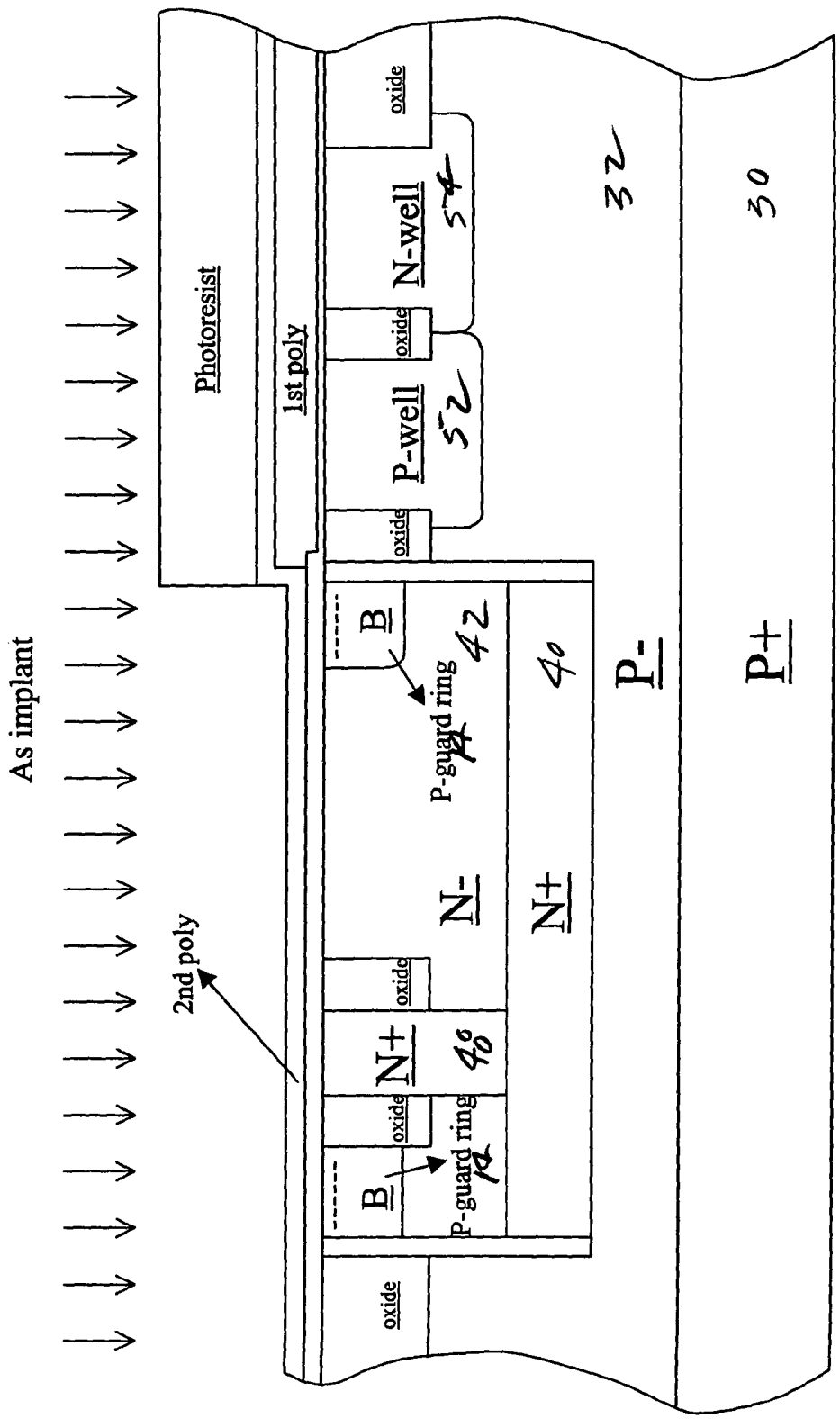
Figure 13:
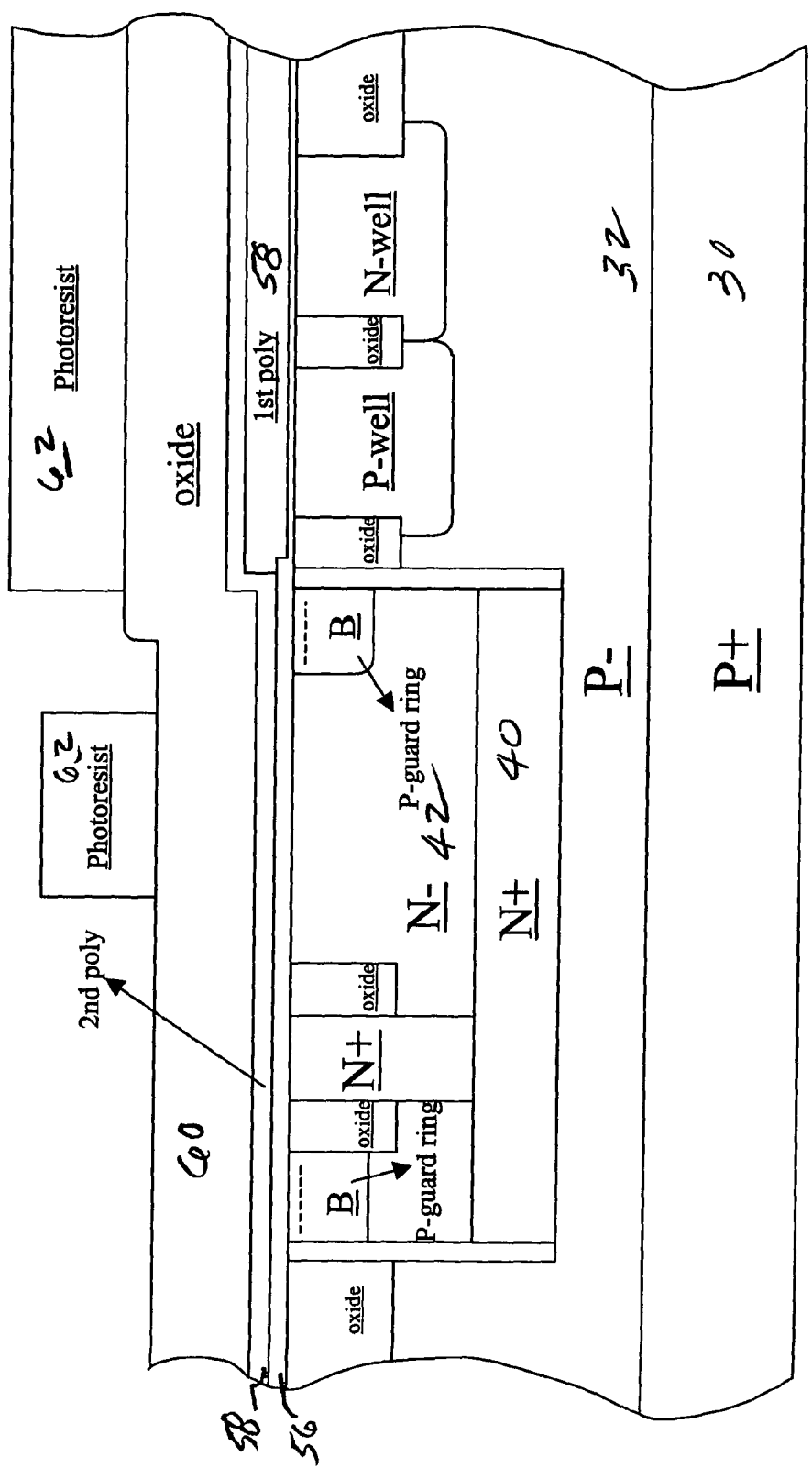

Thereafter, a photoresist pattern is formed to cover the integrated circuit area as shown in FIG. 12, and then arsenic is implanted (30-150 nm) into the surface of the diode region. This arsenic implant facilitates the later ohmic contact of a surface electrode to the surface of the diode. In FIG. 13, the photoresist of FIG. 12 is removed and a layer 60 of CVD silicon oxide is deposited with thickness on the order of 100-400 nm. A photoresist pattern 62 is then employed to define the MOS transistor unit cells for the power diode and to cover the integrated circuit area. It will be appreciated that mask 62 is used in forming a plurality of unit cells.

Figure 14:
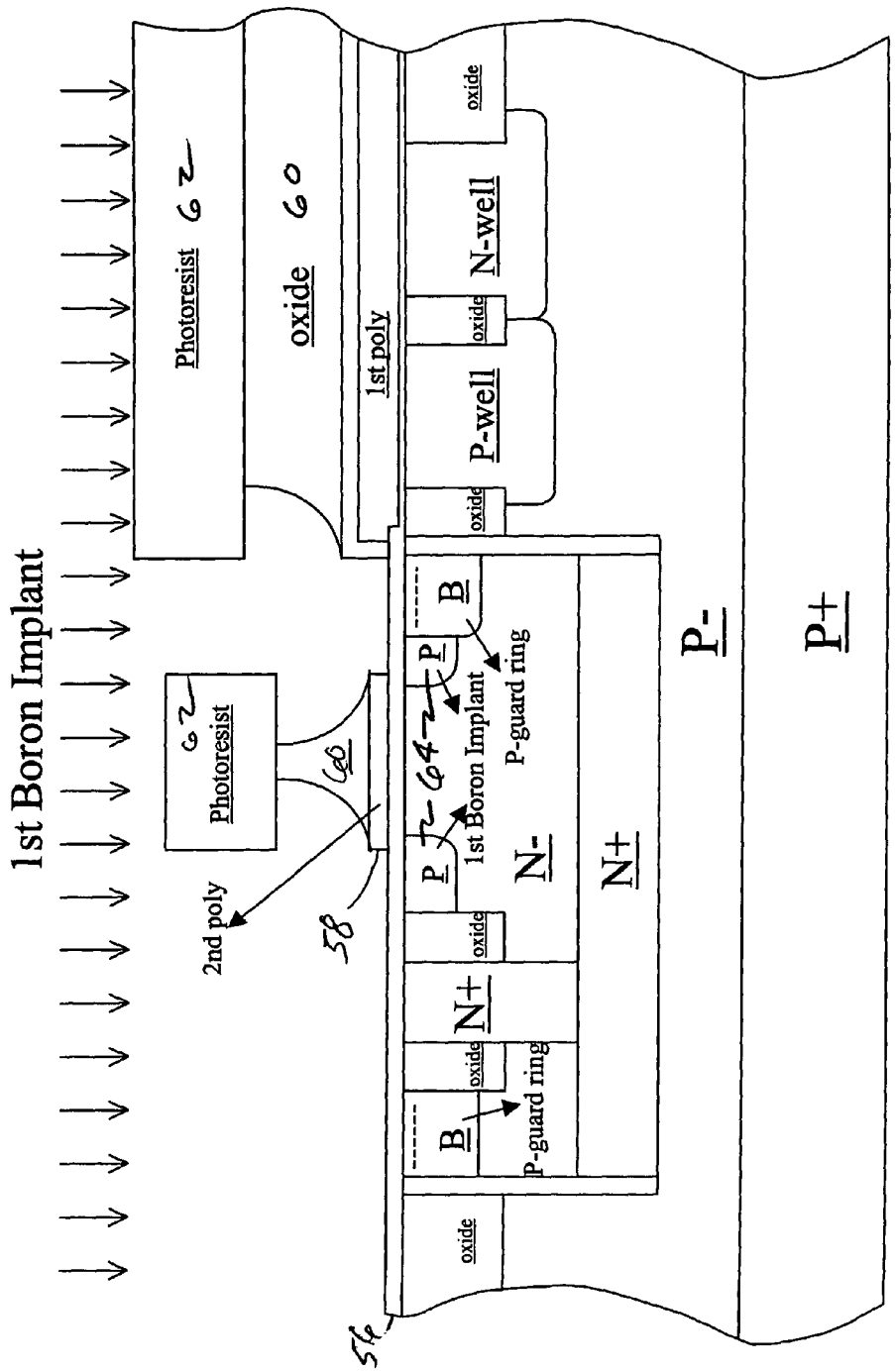

Isotropic etch is then applied as shown in FIG. 14 to variably etch oxide 60 under photoresist mask 62 and remove oxide 60 elsewhere over the diode region. It will be appreciated that the oxide etch stops at polysilicon layer 58. Thereafter, using the same mask, polysilicon layer 58 is anisotropically etched and removed from silicon layer 56 over the diode region. A first boron implant (dose=1.5~5.5E12/cm², energy 40-80 KeV) forms P doped regions 64 aligned with gate oxide 58 in the diode structure. This boron implant can also be performed before the anisotropic polysilicon etch.

Figure 15:
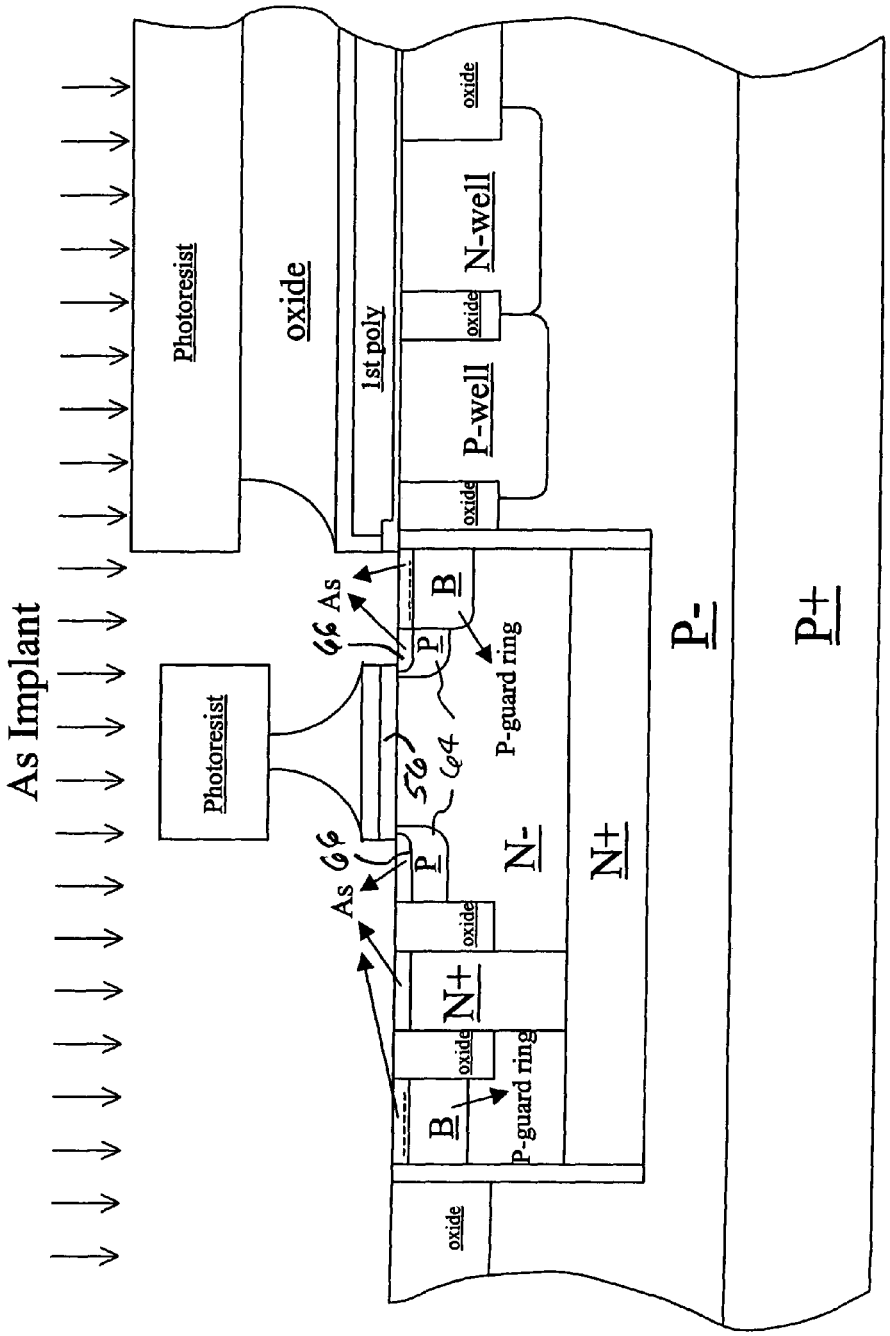

Thereafter, oxide 56 is removed from the surface of the diode region except for the gate structure as shown in FIG. 15. Arsenic is then implanted (1.0~5.0E13, energy 40-60 KeV) followed by rapid thermal annealing for subsequently forming N doped source/drain regions 66 in P doped regions 64. The rapid thermal annealing drives the implanted arsenic under gate oxide 56.

Figure 16:
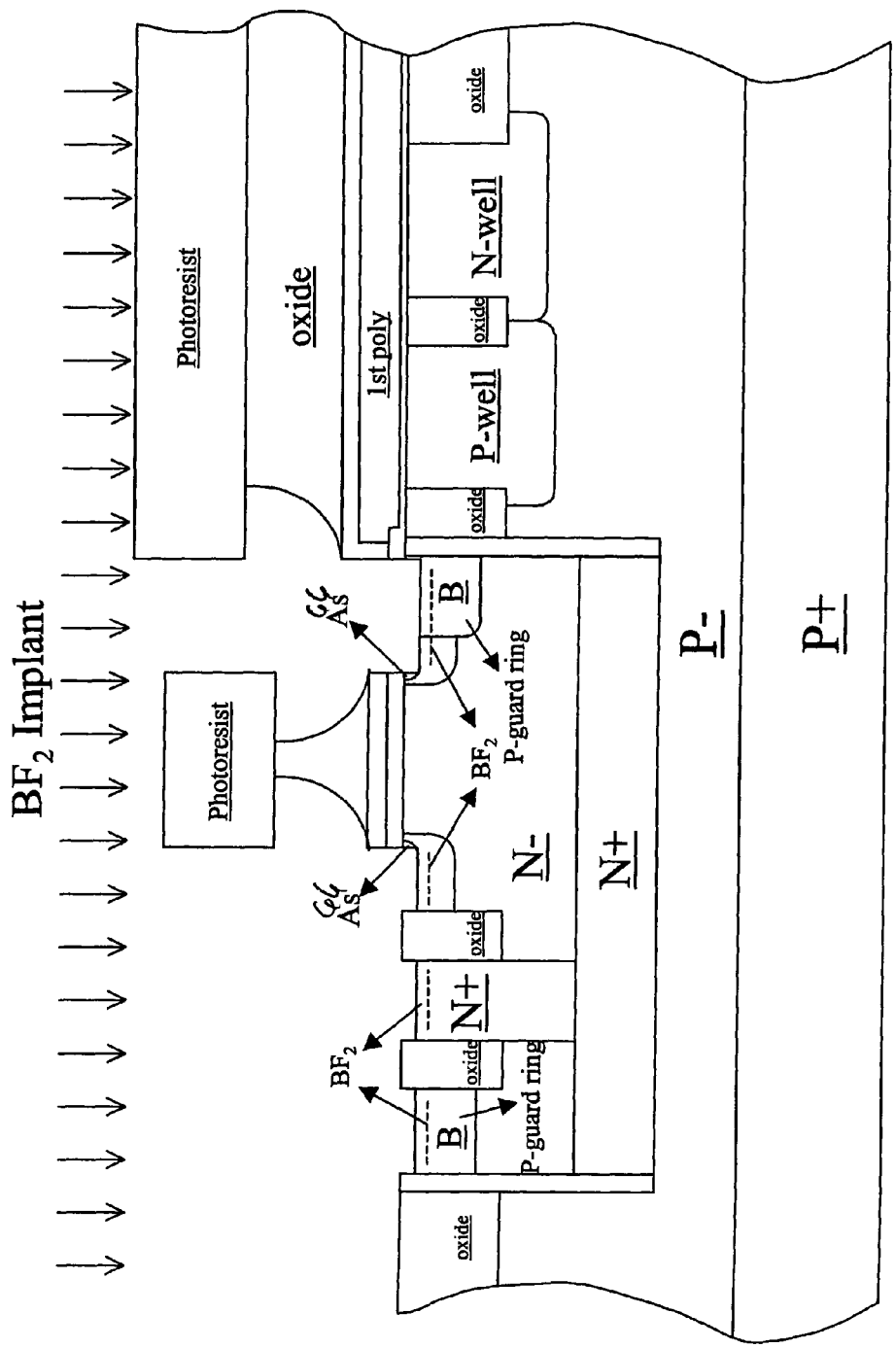
Figure 17:
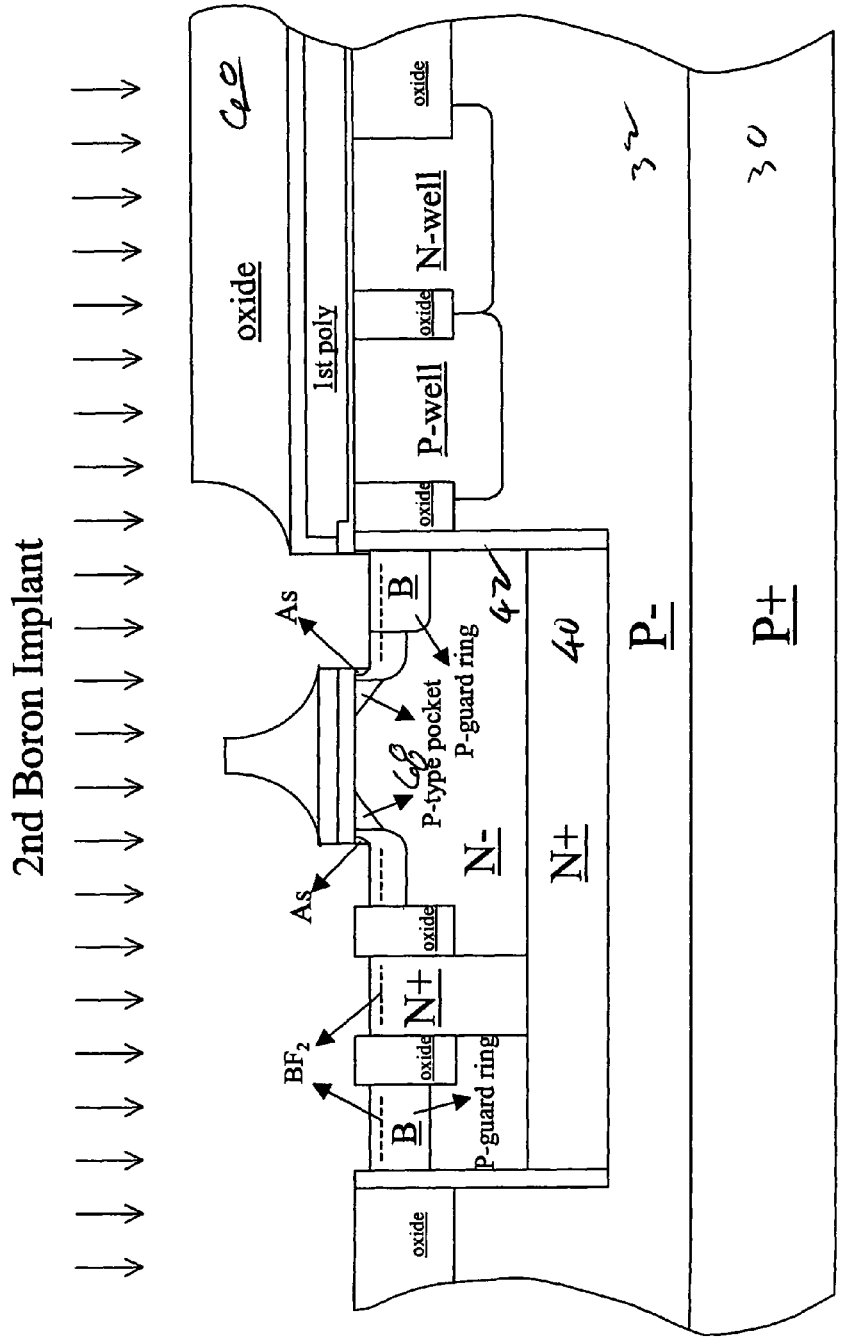

The exposed silicon surface of the device region is then anisotropically etched to remove 50-200 nm of silicon, as shown in FIG. 16, and thereafter a $BF_2$ implant (dose=1.0~5.0E15; energy 10-60 KeV) is implanted and annealed to activate the $BF_2$ and increase the P type doping (e.g. boron) in the P doped surface regions. As shown in FIG. 17, photoresist is then removed and a second boron implant (dose=1.0~2.5E12/cm², energy 20-60 KeV) is employed to created lateral graded P-type pockets 68 for the channels of the power diode cells as further described in U.S. Pat. No. 6,624,030, supra.

Figure 18:
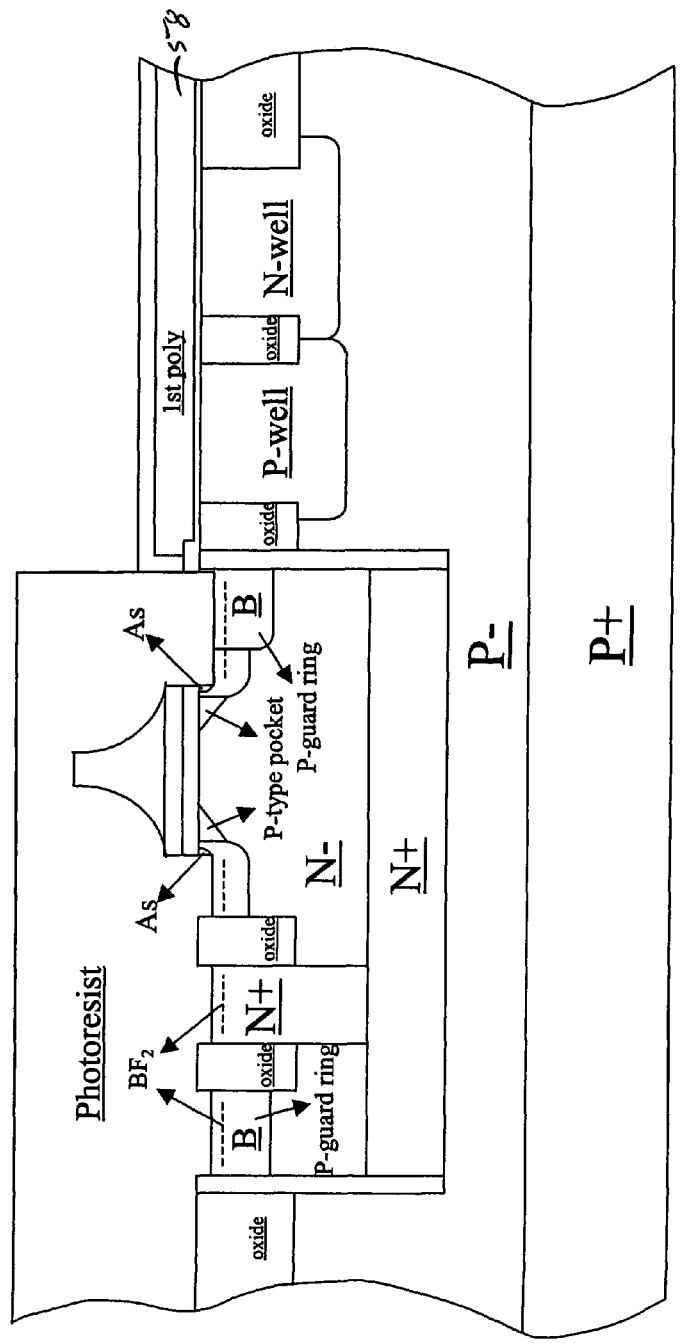
Figure 19:
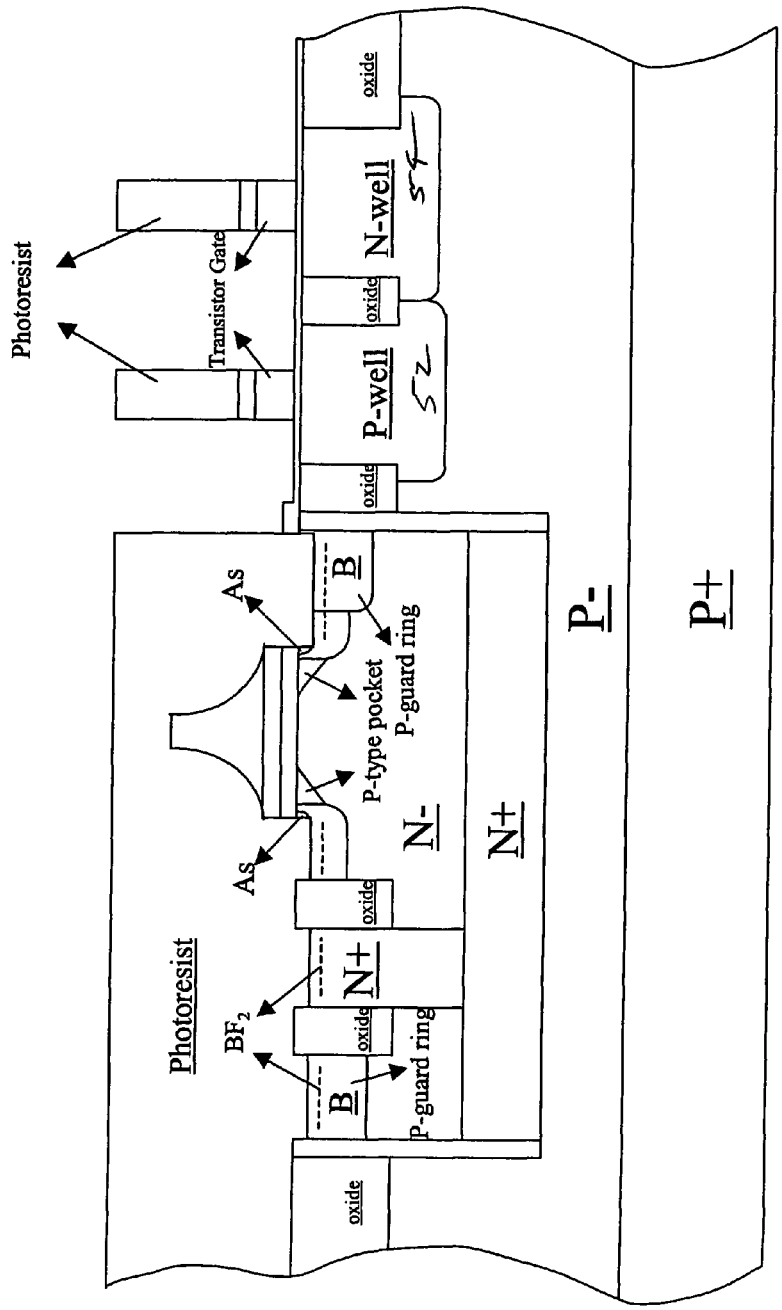
Figure 20:
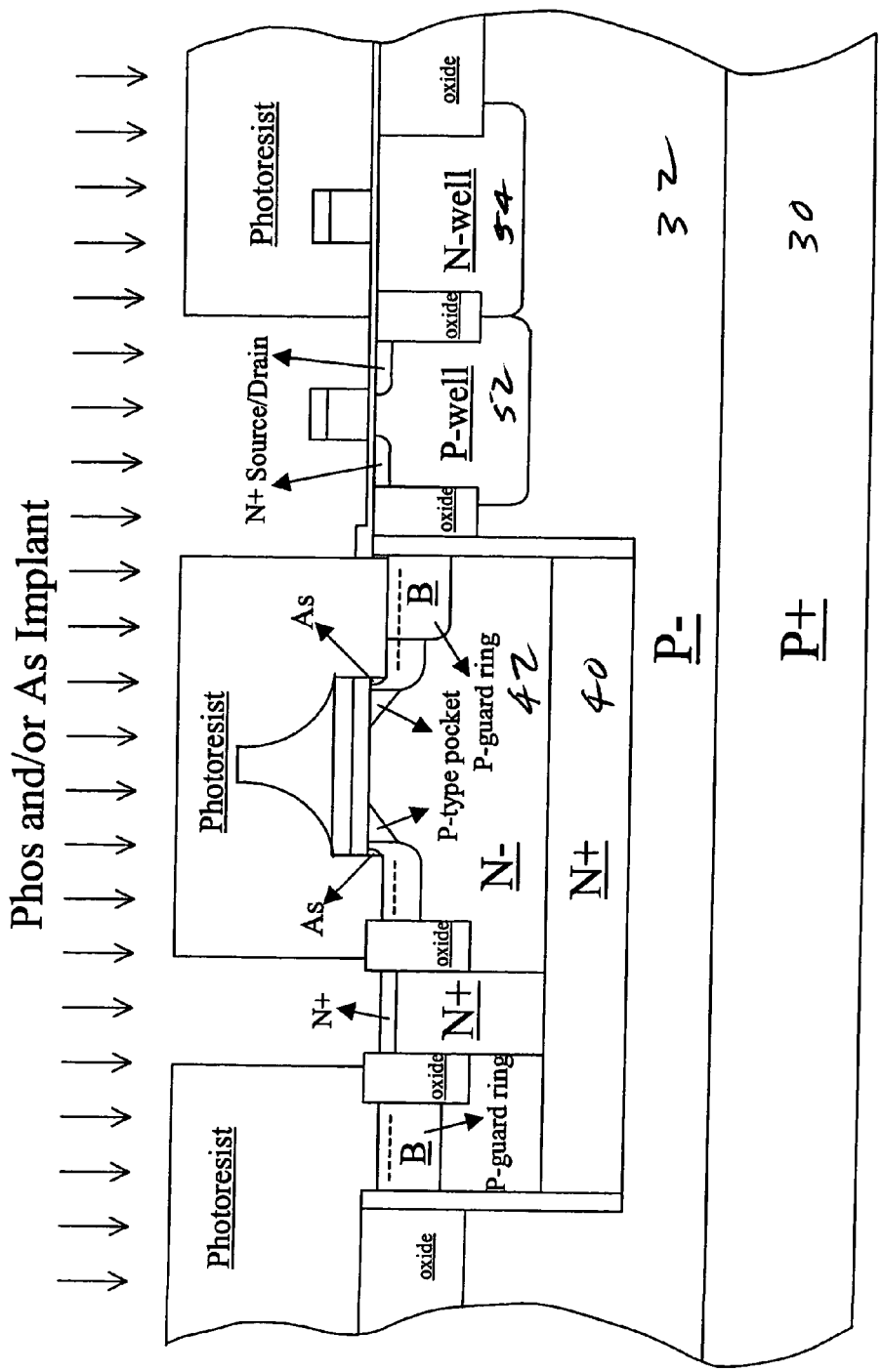

The integrated circuit is then fabricated as shown in FIGS. 18-21. A photoresist pattern is first formed to cover the diode area and expose only the integrated circuit area as shown in FIG. 18, and then oxide layer 60 is removed in the integrated circuit area. In FIG. 19, another photoresist pattern is formed to cover the super diode area and define the MOS transistor gate areas for the integrated circuit. Exposed polysilicon layer is removed by anisotropic polysilicon etch which forms the gate structures of transistors in P well 52 and N well 54. The photoresist is then removed as shown in FIG. 20 and another photoresist pattern is used to cover the super diode area and the P channel MOS transistor (e.g. N well) areas, and then phosphorus or arsenic is implanted to form N channel source and drain and to dope the N channel transistor polysilicon gate as shown in FIG. 20.

Figure 21:
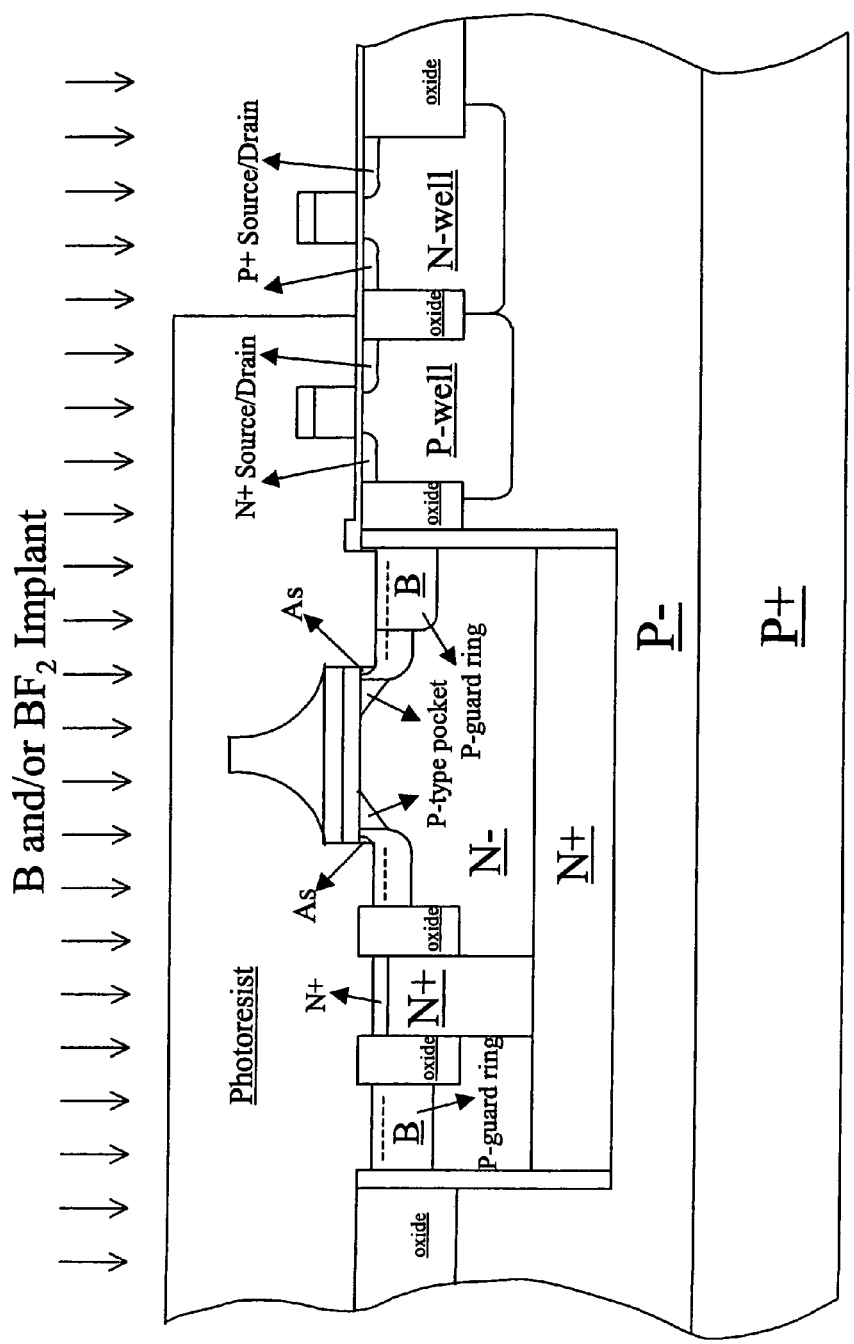
Figure 22:
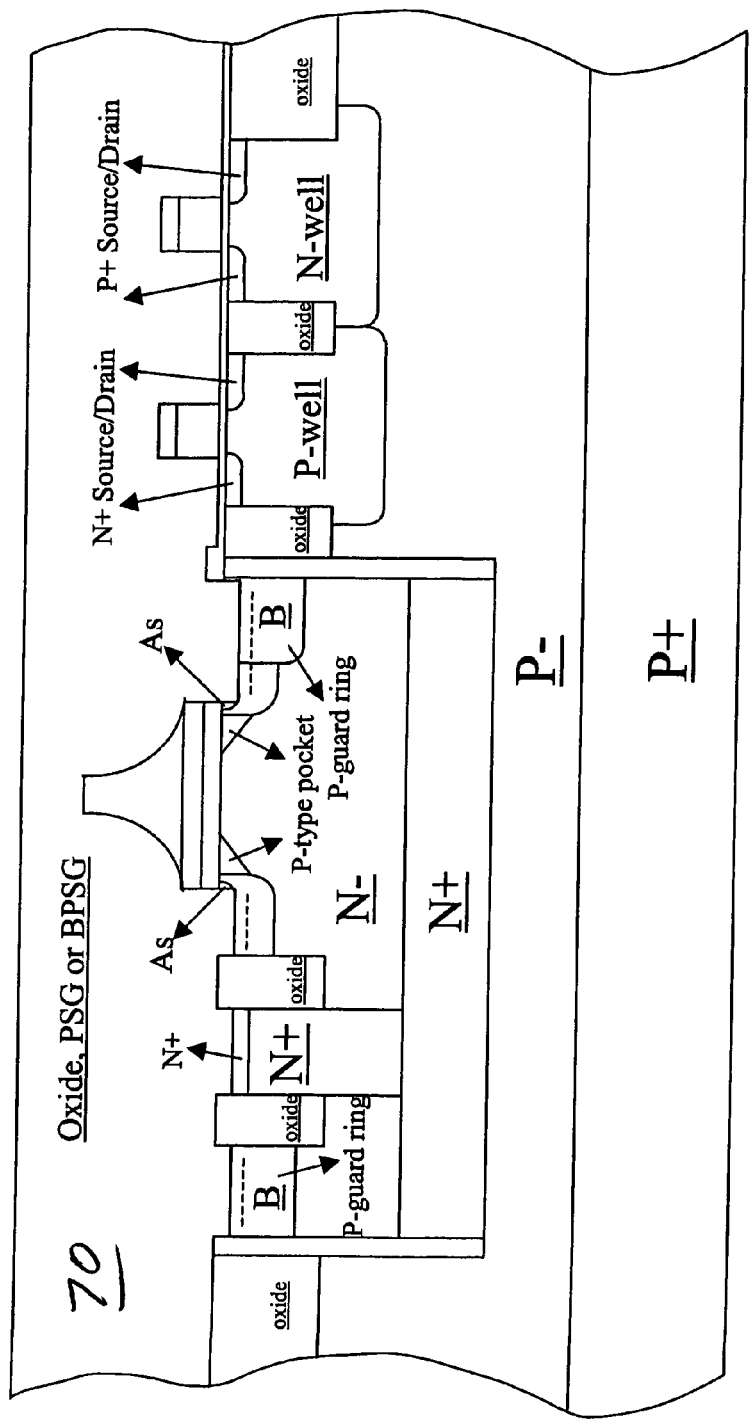
Figure 23:
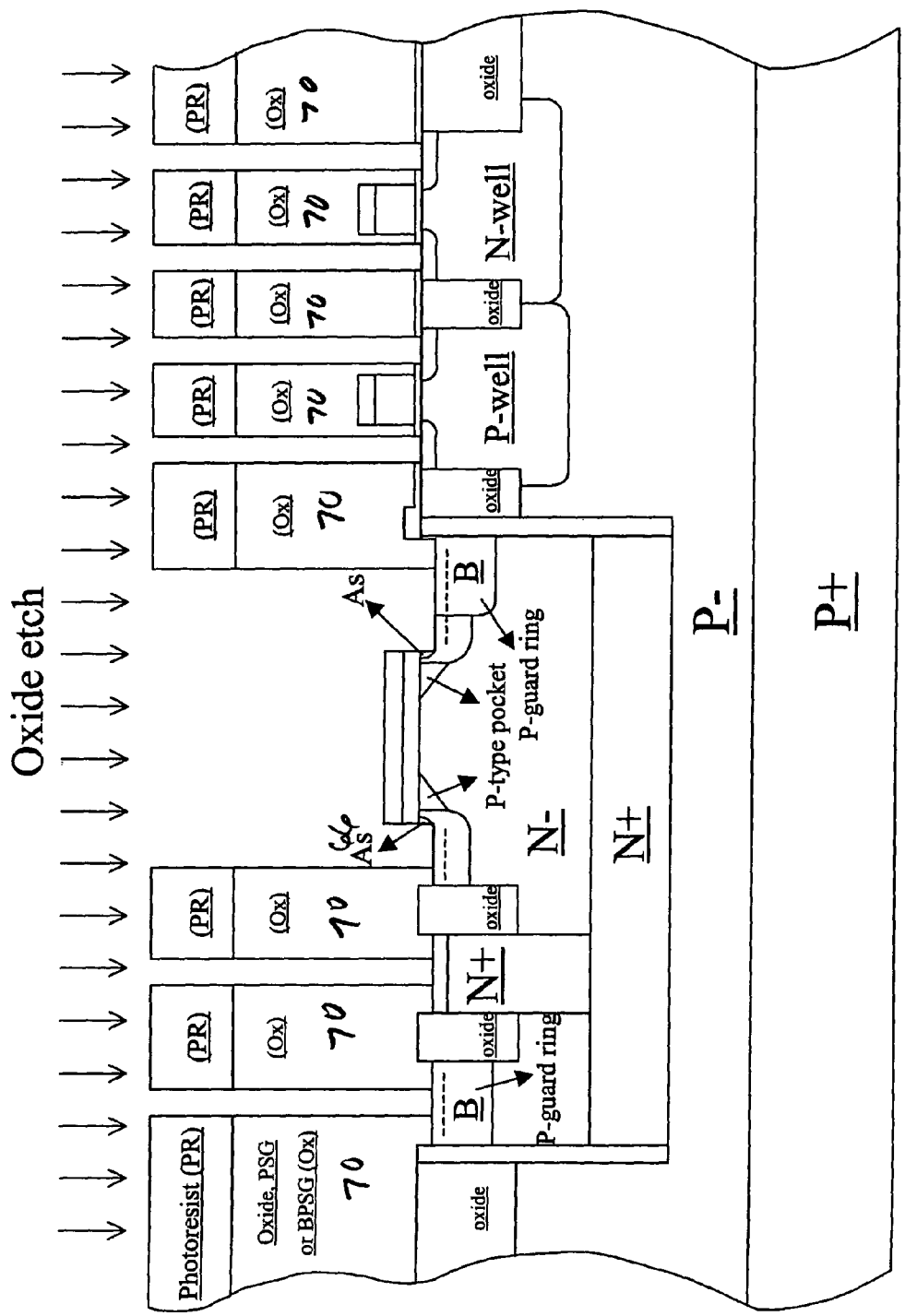
Figure 24:
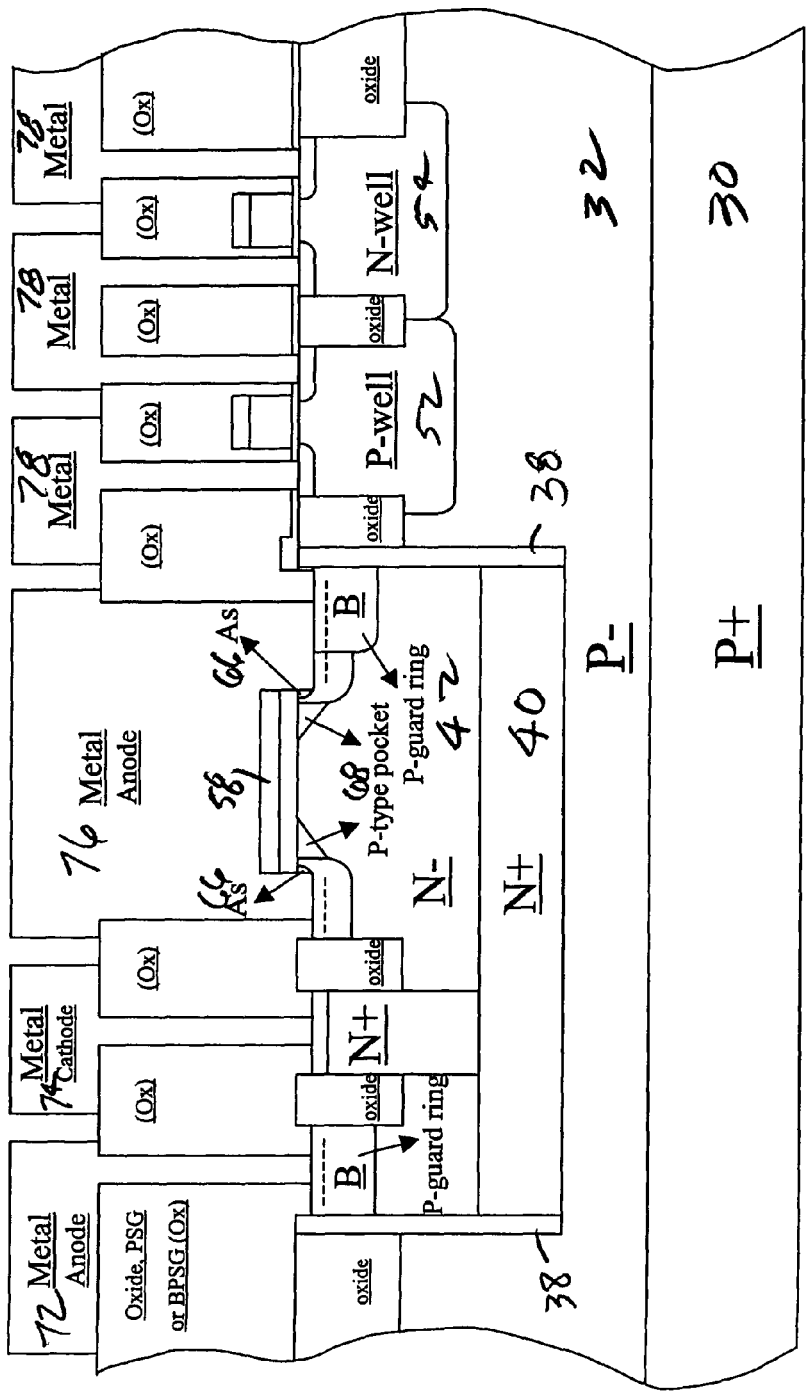

The photoresist is then removed as shown in FIG. 21 and another photoresist pattern covers the power diode area and the N channel MOS transistor (e.g. P well) areas. Boron and/or $BF_2$ is then implanted to form P channel source and drain regions and to dope the P channel transistor polysilicon gate as shown in FIG. 21. The photoresist is then stripped as shown in FIG. 22, and a layer 70 of inter-dielectric such as CVD silicon oxide, PSG or BPSB is deposited on the surface of the structure. Oxide layer 70 is then photoresist masked to define contact areas followed by etch of the exposed oxide layer to open contact areas for the power diode and the integrated circuit. In FIG. 24 the device is completed by removing the photoresist and forming metal inter-connects by depositing a layer of metal and using conventional photo masking and etching to form a metal anode contact 72, metal cathode contact 74, a metal anode contact 76 to surface source/drain 66 and gate 58, and source and drain contacts 78 to the CMOS transistors in P well 52 and N well 54.

Figure 25:
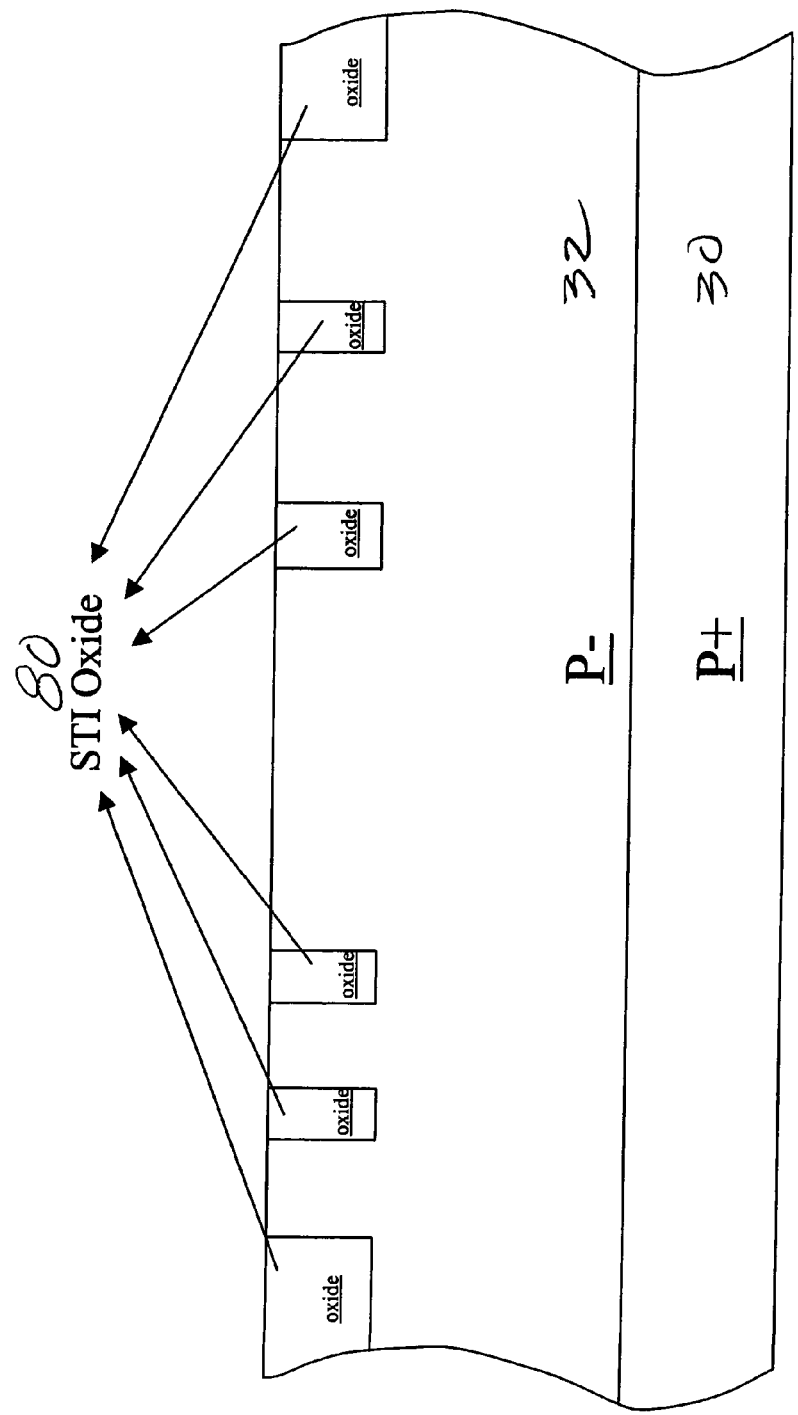
FIGS. 25-26 are section views illustrating the fabrication of an isolated diode region in accordance with one embodiment of the invention.
Figure 26:
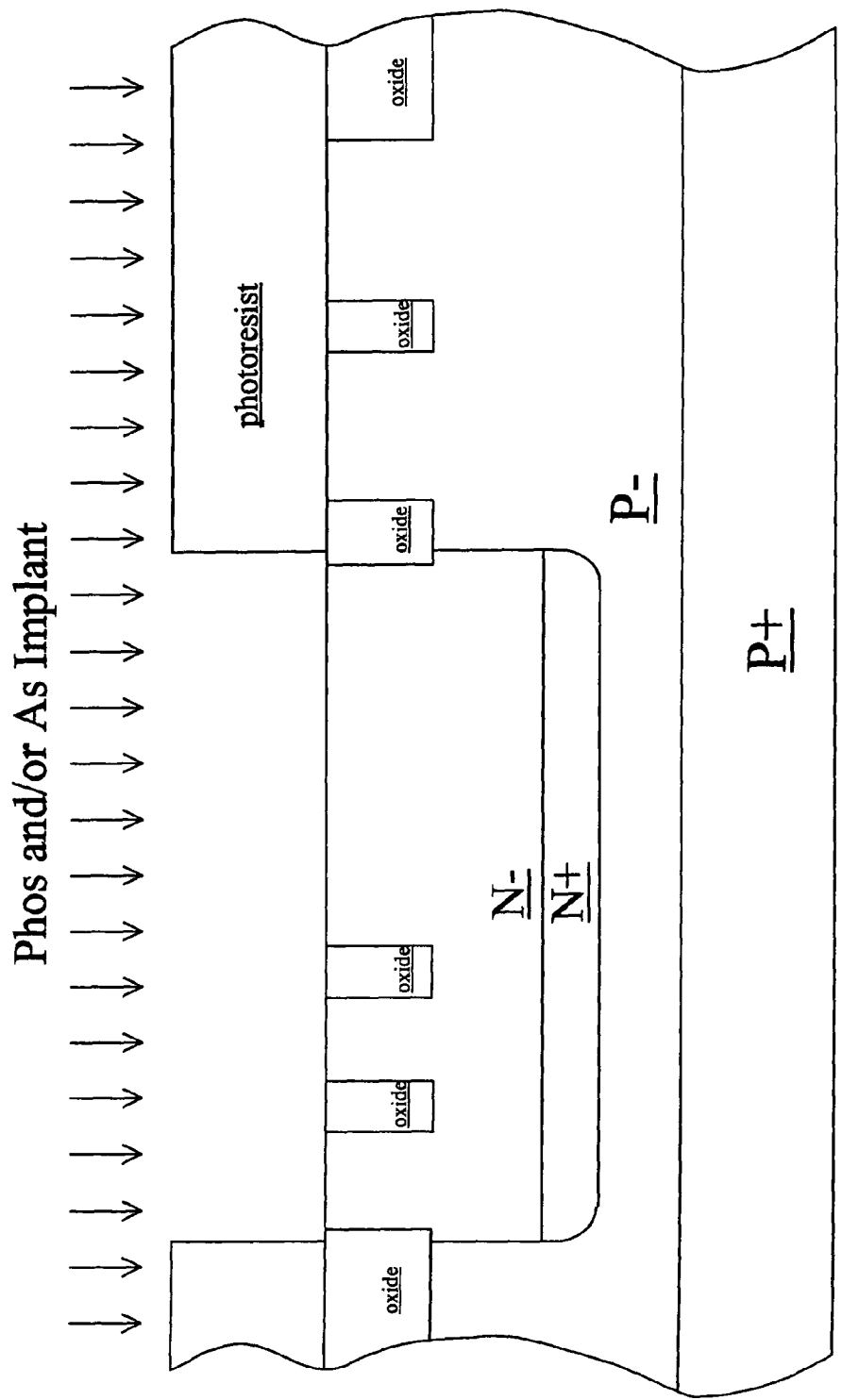

In the final product illustrated in FIG. 24, the oxide or nitride spacers 38 are employed to electrically isolate the power diode from the integrated circuit. FIG. 25-26 are section views illustrating the fabrication of the isolated diode region in accordance with another embodiment of the invention. As shown in FIG. 25 the starting P−/P+ substrate has shallow trench isolation regions 80 formed to provide isolation areas without the forming of a trench as shown in FIG. 2, above. As noted in the description of FIG. 4, conventional local oxidation can be used rather than the conventional shallow trench isolation method. Thereafter as shown in FIG. 26, a photoresist pattern is employed to define the super diode areas with phosphorus and/or arsenic multiple implants with different energies and doses to form the N−/N+ well for the power diode. Again, if more than one power diode is to be fabricated, multiple photoresist openings would be defined.

Figure 27:
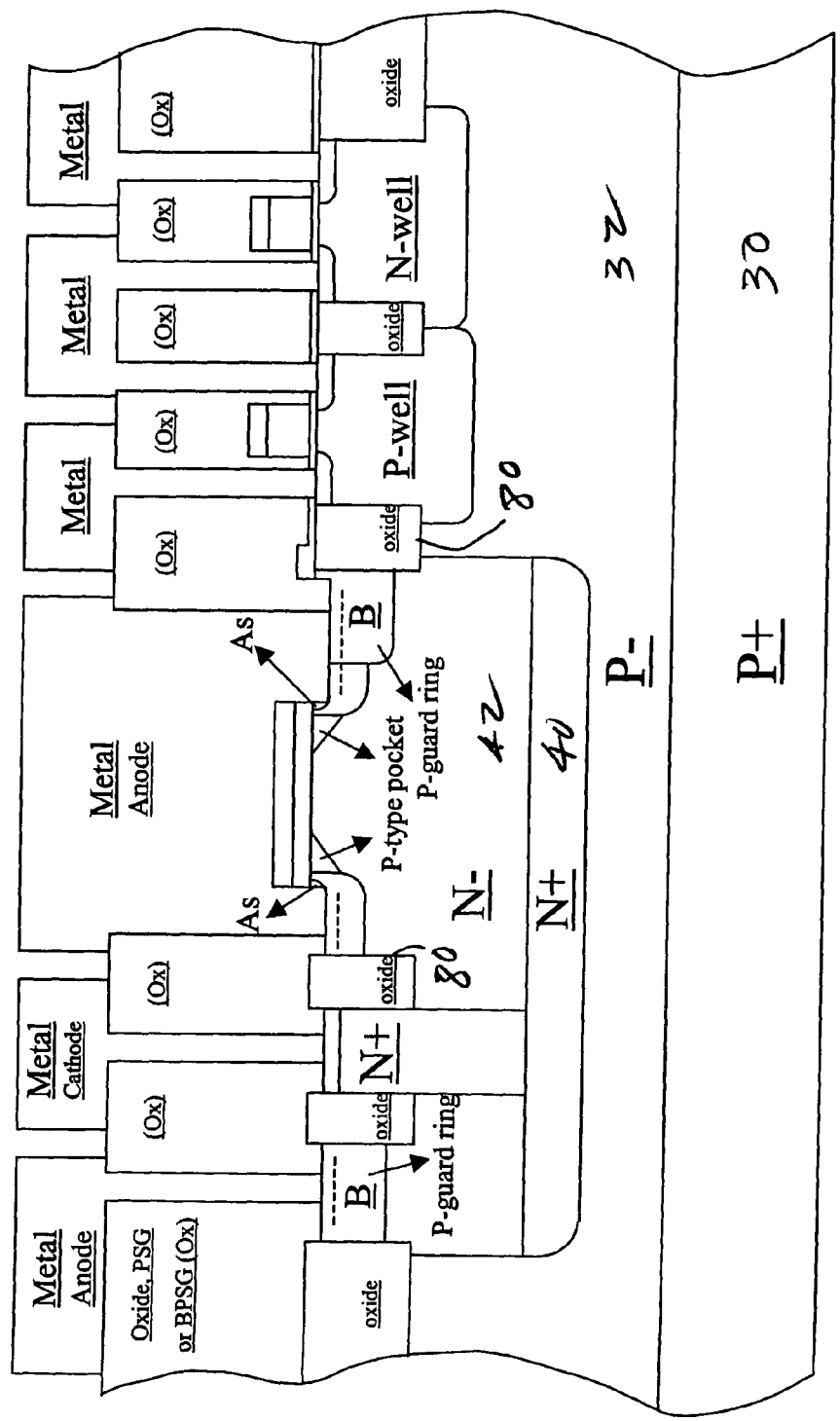
FIGS. 27-31 are section views illustrating alternative power diode structures.

The final product using shallow trench isolation is shown in FIG. 27 which is similar to the final structure shown in FIG. 24 except for the oxide or nitride spacers 38 in FIG. 24 being replaced by the STI oxide 80. Note that all process steps as shown in FIGS. 5-24 are employed in forming the final product of FIG. 27.

Figure 28:
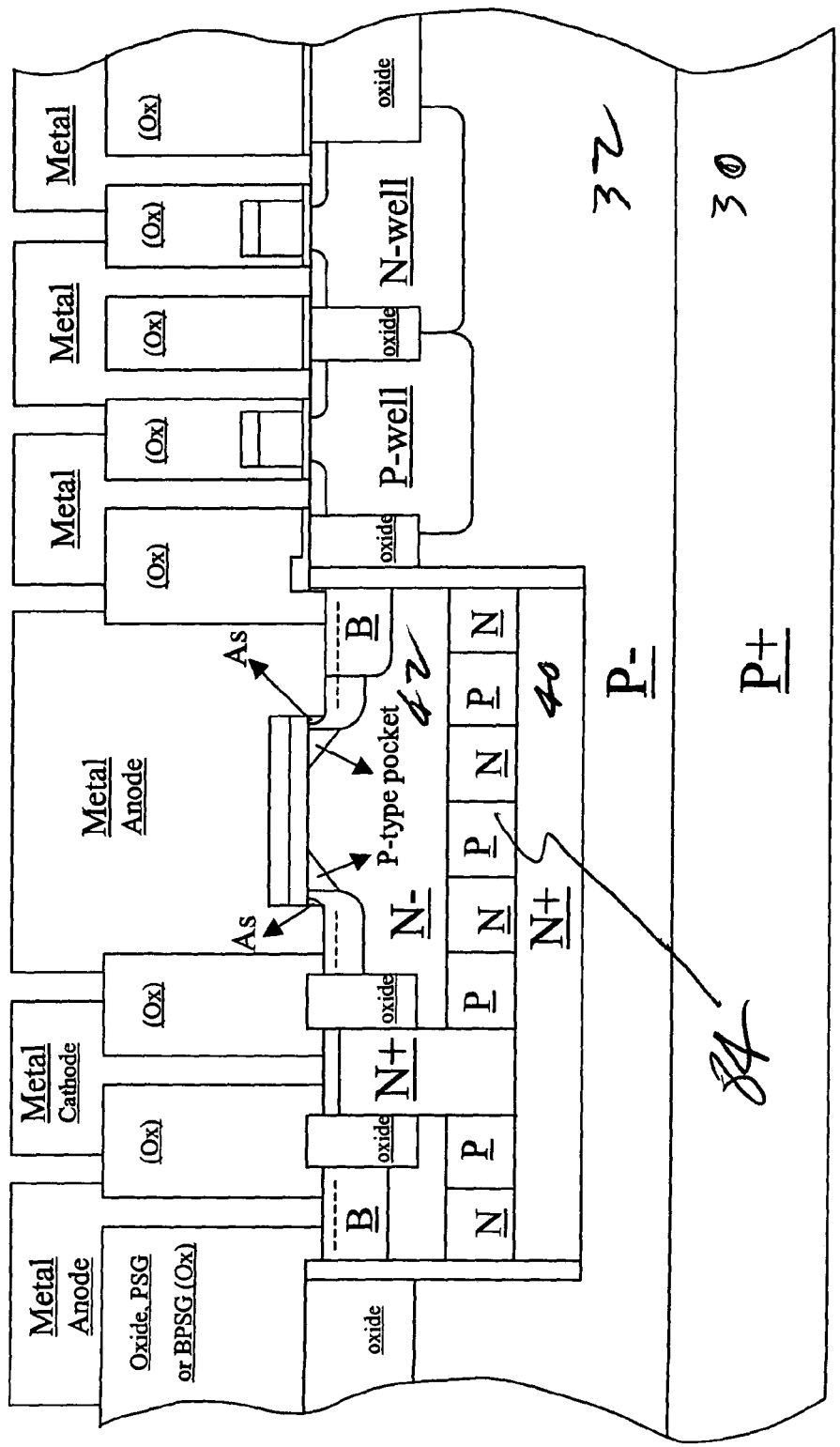

FIG. 28 illustrates a section view of another structure in accordance with the invention which is similar to the device of FIG. 24 except for the provision of a super junction region 84 between N+ layer 40 and N− layer 42 of the power diode. Provision of the super junction is described in U.S. Pat. No. 6,743,703, supra.

Figure 29:
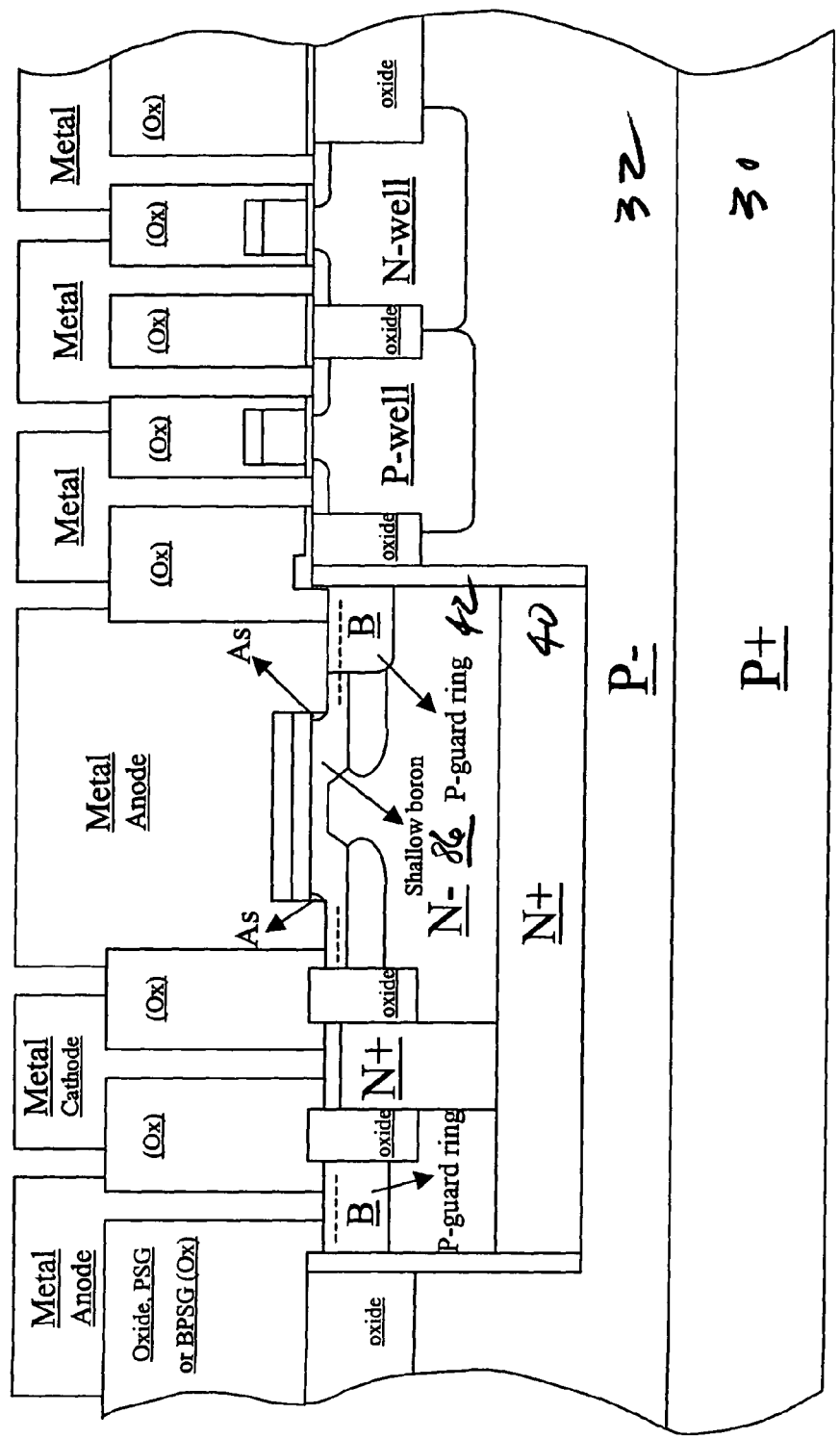

In another embodiment of the invention, reduced reverse bias leakage current in the power diode can be provided by a shallow boron implant under the gate of the metal anode as shown at 86 in FIG. 29. The use of a lightly doped boron implant under all of the gate structure for reducing reverse bias leakage current is described in co-pending application Ser. No. 10/159,558, supra.

Figure 30:
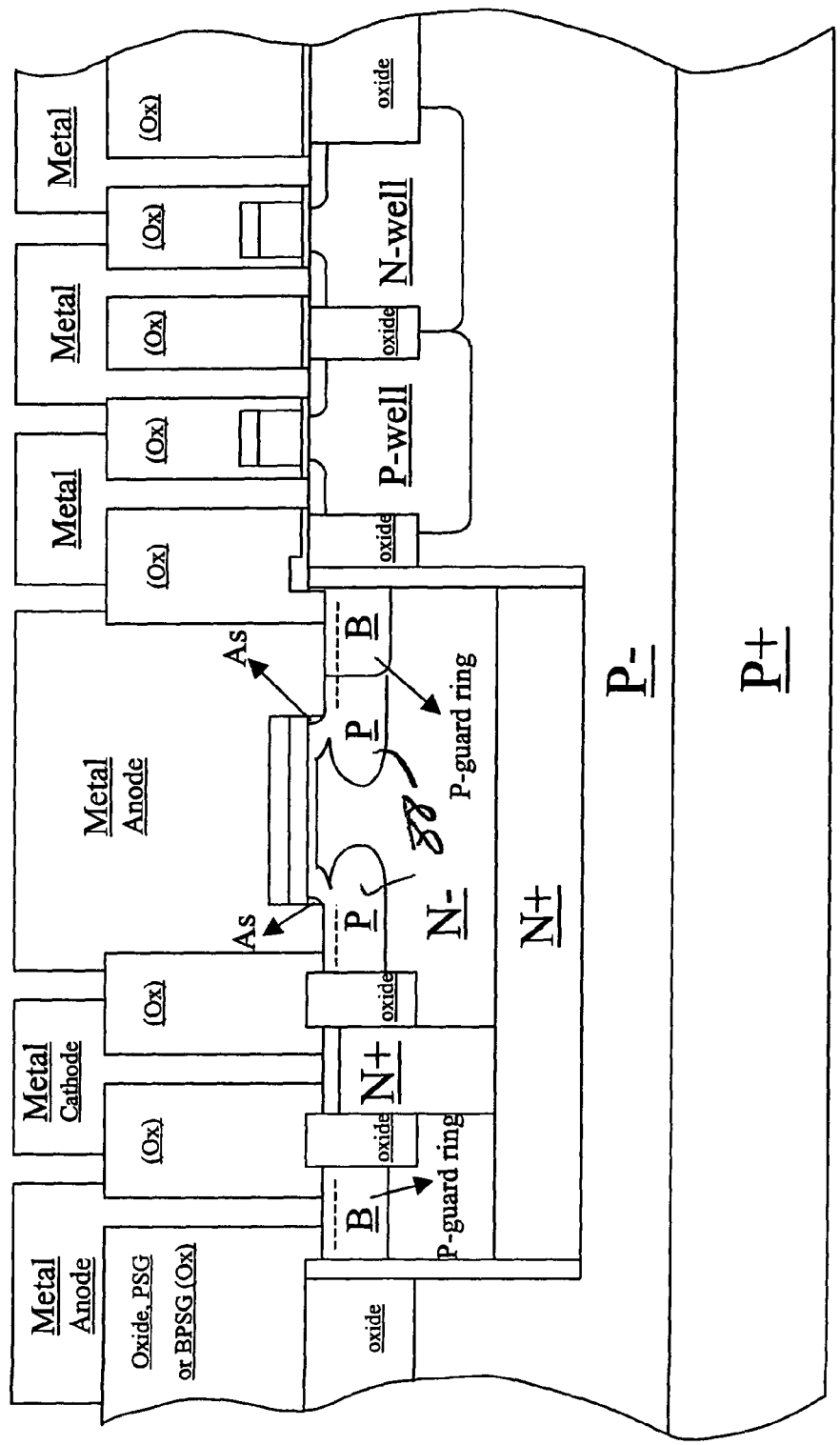

Enhanced pinch off for current limiting can be provided in the power diode by providing a P doping profile 88 in the body so tailored with ion implantation that a depletion region pinches off to limit current, as described in U.S. Pat. No. 6,515,330, supra. This is shown in FIG. 30.

Figure 31:
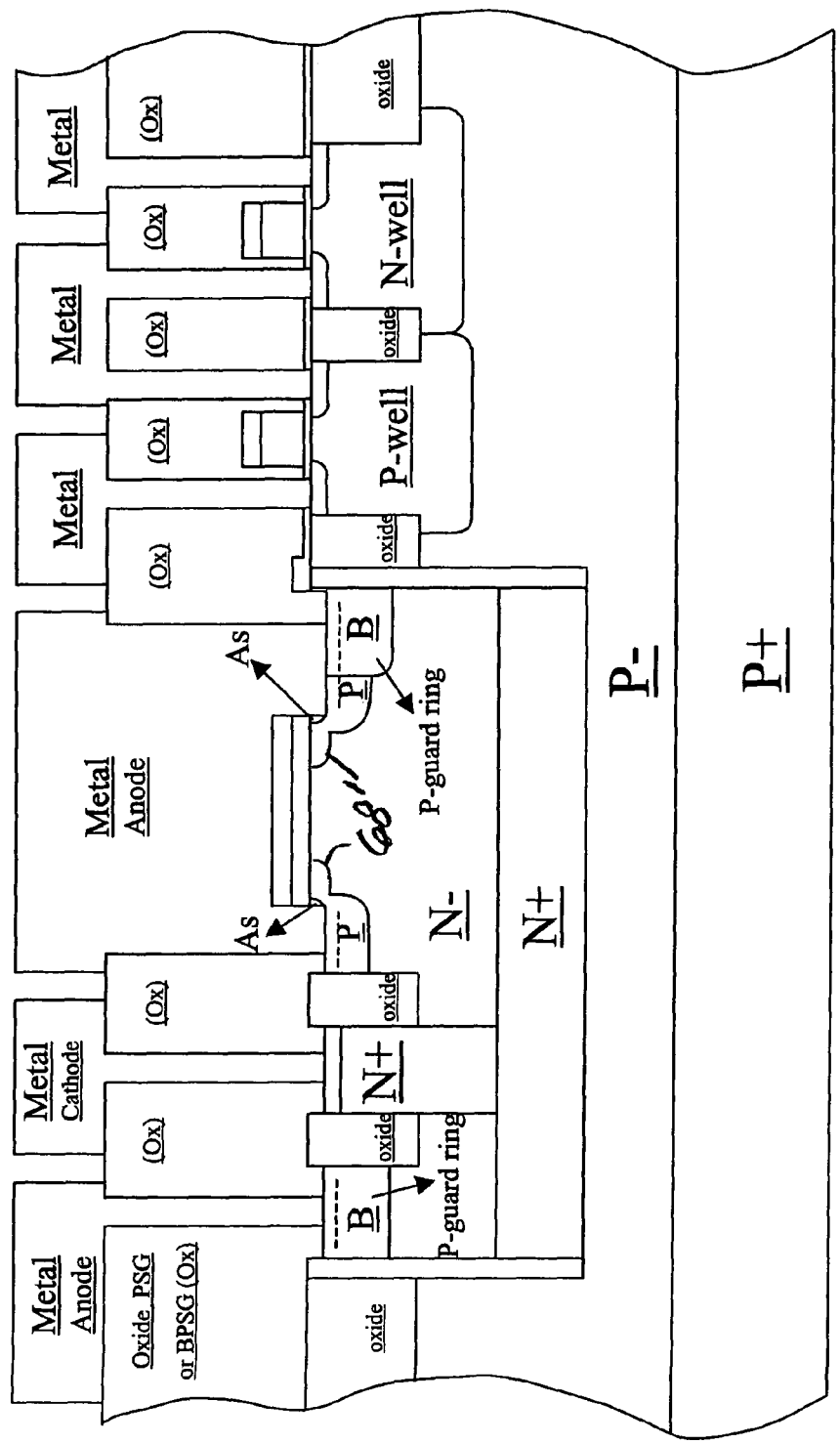

In another embodiment of the invention, the channel regions need not be tapered as shown at 68 in FIG. 24, but can have an essentially constant thickness as shown at 68' in the finished product in FIG. 31. This structure and the method of fabrication is described in U.S. Pat. No. 6,420,225, supra.

There have been described several embodiments of an integrated circuit including one or more super power diodes in accordance with the invention. However, while the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A semiconductor integrated circuit comprising:
   a) semiconductor substrate having material of a first conductivity type,
   b) a first region in said substrate in which an integrated circuit is fabricated,
   c) a second region in said substrate having material of a second conductivity type in which a power diode is fabricated, wherein the second regions comprises a first subregion having a first concentration of material of the second conductivity type, and a second subregion having a second concentration of material of the second conductivity type, wherein the power diode includes a conductive layer on a surface of the substrate functioning as a first electrode, and a conductive via extending from the surface into the substrate and contacting semiconductor material of the second conductivity type which functions as a second electrode, and
   d) dielectric material between the first region and the second region providing electrical isolation between the first region and the second region, wherein the power diode comprises a plurality of MOS source/drain elements and associated gate elements all connected together by the first electrode, a semiconductor layer of a second conductivity type in the second region and in which the plurality of MOS source/drain elements are fabricated, the semiconductor layer being contacted by the second electrode.

2. The integrated circuit of claim 1 where the dielectric material comprises silicon oxide formed in a surface of the semiconductor substrate, and the second region includes implanted dopant of a second conductivity type.

3. The integrated circuit of claim 1 wherein the dielectric material comprises silicon oxide.

4. The integrated circuit as defined by claim 1 wherein the second region includes epitaxial semiconductor material grown in a trench in one surface of the substrate, and the dielectric material comprises spacers formed on sidewalls of the trench.

5. The integrated circuit as defined by claim 1 wherein each MOS source/drain element is electrically connectable to the semiconductor layer through a channel controlled by a gate element.

6. The integrated circuit as defined by claim 5 wherein each channel is laterally graded under a gate element with a sloped P-N junction separating the channel region from the semiconductor layer.

7. The integrated circuit as defined by claim 6 wherein the P-N junction underlies all of the gate element to provide reduced reverse bias leakage current.

8. The integrated circuit as defined by claim 7 wherein the dielectric material comprises silicon oxide formed in a surface of the semiconductor substrate, and the second region includes implanted dopant of a second conductivity type.

9. The integrated circuit as defined by claim 1 wherein the dielectric material comprises silicon oxide.

10. The integrated circuit as defined by claim 1 wherein the second region includes epitaxial semiconductor material grown in a trench in surface of the substrate, and the dielectric material comprises spacers formed on side walls of the trench.

* * * * *

UNITED STATES PATENT AND TRADEMARK OFFICE
CERTIFICATE OF CORRECTION

| | | |
|---|---|---|
| PATENT NO. | : 7,964,933 B2 | Page 1 of 1 |
| APPLICATION NO. | : 11/821234 | |
| DATED | : June 21, 2011 | |
| INVENTOR(S) | : Paul Chang et al. | |

It is certified that error appears in the above-identified patent and that said Letters Patent is hereby corrected as shown below:

On the face of the patent, under "Related U.S. Application Data" replace all of the text with the following text:

Continuation of application no. 11/040,180, filed on January 20, 2005, now Pat. No. 7,250,668.

Column 1, lines 2 to 3, cancel the text beginning with "11/040,280, filed Jan. 20, 2005 now U.S." and ending with "Pat. No. 7,415,400," and insert the following text:

--11/040,180, filed on January 20, 2005, now Pat. No. 7,250,668.--.

Signed and Sealed this
Twentieth Day of March, 2012

David J. Kappos
*Director of the United States Patent and Trademark Office*